US008230156B2

(12) United States Patent
Tanaka et al.

(10) Patent No.: US 8,230,156 B2
(45) Date of Patent: Jul. 24, 2012

(54) METHOD FOR CONTROLLING NON-VOLATILE SEMICONDUCTOR MEMORY SYSTEM

(75) Inventors: Yoshiyuki Tanaka, Yokohama (JP); Makoto Yatabe, Yokohama (JP); Takeaki Sato, Yokohama (JP); Kazuya Kawamoto, Sagamihara (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 11/931,101

(22) Filed: Oct. 31, 2007

(65) Prior Publication Data

US 2008/0059695 A1 Mar. 6, 2008

Related U.S. Application Data

(60) Continuation of application No. 10/913,865, filed on Aug. 6, 2004, which is a division of application No. 09/130,818, filed on Aug. 7, 1998, now Pat. No. 6,845,438.

(30) Foreign Application Priority Data

Aug. 8, 1997 (JP) .................................. 1997-214561
Apr. 28, 1998 (JP) .................................. 1998-119099

(51) Int. Cl.
*G06F 12/02* (2006.01)
(52) U.S. Cl. ................................ 711/103; 711/E12.008
(58) Field of Classification Search .................... 711/103
See application file for complete search history.

(56) References Cited

U.S. PATENT DOCUMENTS

| | | | |
|---|---|---|---|
| 3,432,795 A | 3/1969 | Jayne | |
| 4,849,944 A | 7/1989 | Matsushita | |
| 4,889,495 A | 12/1989 | Kimura | |
| 5,210,855 A | 5/1993 | Bartol | ............................ 395/500 |
| 5,329,491 A | 7/1994 | Brown et al. | ................... 365/226 |
| 5,438,573 A | 8/1995 | Mangan et al. | |
| 5,450,365 A | 9/1995 | Adachi | .......................... 365/226 |
| 5,457,658 A * | 10/1995 | Niijima et al. | ................. 365/218 |

(Continued)

FOREIGN PATENT DOCUMENTS

DE 19623853 7/1997

(Continued)

OTHER PUBLICATIONS

European Search Report of Application No. 98114979.2-2212, Jan. 21, 2004.

(Continued)

*Primary Examiner* — Edward Dudek, Jr.
*Assistant Examiner* — Ryan Dare
(74) *Attorney, Agent, or Firm* — Oblon, Spivak, McClelland, Maier & Neustadt, L.L.P.

(57) ABSTRACT

In a memory system using a storage medium, which is inserted into an electronic apparatus via a connector to add a memory function thereto, the storage medium has a GROUND terminal, a power supply terminal a control terminal and a data input/output terminal, and the connector has a function of being sequentially connected to each of the terminals. When the storage medium is inserted into the connector, the GROUND terminal and control terminal of the storage medium are connected to corresponding terminals of the connector before the power supply terminal and data input/output terminal of the storage medium are connected to corresponding terminals of the connector. Thus, it is possible to improve the stability when a memory card is inserted into or ejected from the memory system.

14 Claims, 45 Drawing Sheets

U.S. PATENT DOCUMENTS

| | | | |
|---|---|---|---|
| 5,463,772 A * | 10/1995 | Thompson et al. | 707/101 |
| 5,471,604 A | 11/1995 | Hasbun et al. | |
| 5,537,592 A * | 7/1996 | King et al. | 707/200 |
| 5,544,356 A * | 8/1996 | Robinson et al. | 707/205 |
| 5,555,391 A * | 9/1996 | De Subijana et al. | 711/113 |
| 5,579,502 A * | 11/1996 | Konishi et al. | 711/103 |
| 5,584,030 A | 12/1996 | Husak et al. | |
| 5,630,093 A * | 5/1997 | Holzhammer et al. | 711/115 |
| 5,636,347 A | 6/1997 | Muchnick et al. | |
| 5,717,951 A * | 2/1998 | Yabumoto | 710/11 |
| 5,828,892 A | 10/1998 | Mizuta | 395/750 |
| 5,905,993 A | 5/1999 | Shinohara | |
| 6,278,678 B1 * | 8/2001 | Iida | 369/83 |
| 6,611,907 B1 * | 8/2003 | Maeda et al. | 711/170 |
| 2002/0069314 A1 | 6/2002 | Miyauchi | |
| 2003/0200411 A1 * | 10/2003 | Maeda et al. | 711/173 |
| 2005/0036372 A1 * | 2/2005 | Sasaki | 365/202 |
| 2005/0144363 A1 * | 6/2005 | Sinclair | 711/103 |
| 2005/0193161 A1 * | 9/2005 | Lee et al. | 711/103 |

FOREIGN PATENT DOCUMENTS

| | | |
|---|---|---|
| EP | 0704 820 A1 | 9/1995 |
| EP | 0712067 | 5/1996 |
| EP | 0 752 668 A1 | 1/1997 |
| JP | 63-240615 | 10/1988 |
| JP | 01-296482 | 11/1989 |
| JP | 04084216 A | 3/1992 |
| JP | 06-309243 | 11/1994 |
| JP | 07-041619 | 2/1995 |
| JP | 08-090969 | 4/1996 |
| JP | 08-211973 | 8/1996 |
| JP | 08-221223 | 8/1996 |
| JP | 09-81332 | 3/1997 |
| JP | 09097139 A | 4/1997 |
| JP | 09198201 A | 7/1997 |
| JP | 09-282111 | 10/1997 |
| JP | 09319645 A | 12/1997 |
| JP | 10-049257 | 2/1998 |
| JP | 10-049644 | 2/1998 |
| JP | 11053248 A | 2/1999 |

OTHER PUBLICATIONS

Japanese Office Action issued on Jun. 1, 2007 with English Abstract.
European Search Report dated Sep. 25, 2007.
Japanese language office action and its English language translation for corresponding Japanese application No. 2007-19962 lists the references above.
Japanese Language office action and its English translation for corresponding Japanese application No. 2007-199962 lists the references above.

* cited by examiner

| | | 0      255 | 256      263 |
|---|---|---|---|
| PHYSICAL BLOCK 0 | Page 0 | DATA AREA (256BYTES) | REDUNDANT DIVISION (16BYTES) |
| | Page 1 | | |
| | ⋮ | | |
| | Page 15 | | |
| PHYSICAL BLOCK 1 | Page 0 | | |
| | Page 1 | | |
| | ⋮ | | |
| | Page 15 | | |
| ⋮ | ⋮ | ⋮ | ⋮ |
| PHYSICAL BLOCK 511 | Page 0 | | |
| | Page 1 | | |
| | ⋮ | | |
| | Page 15 | | |

FIG. 2

PRIOR ART

| | | |
|---|---|---|
| PHYSICAL BLOCK 0 | SECTOR 0 | 512 BYTES |
| | SECTOR 1 | |
| | ⋮ | |
| | SECTOR 7 | |
| PHYSICAL BLOCK 1 | SECTOR 8 | |
| | SECTOR 9 | |
| | ⋮ | |
| | SECTOR 15 | |
| ⋮ | ⋮ | ⋮ |
| PHYSICAL BLOCK 499 | SECTOR 3992 | |
| | SECTOR 3993 | |
| | ⋮ | |
| | SECTOR 3999 | |

FIG. 3

PRIOR ART

DATA DIVISION

| BYTE | PAGE 0 (EVEN PAGE) | PAGE 1 (ODD PAGE) |
|---|---|---|
| 0~255 | DATA Area-1 | DATA Area-2 |

REDUNDANT DIVISION

| BYTE | EVEN PAGE | ODD PAGE |
|---|---|---|
| 256 | User Data Area | ECC Area-2 |
| 257 | User Data Area | ECC Area-2 |
| 258 | User Data Area | ECC Area-2 |
| 259 | User Data Area | Block Address Area-2 |
| 260 | Data Status Area | Block Address Area-2 |
| 261 | Block Status Area | ECC Area-1 |
| 262 | Block Address Area-1 | ECC Area-1 |
| 263 | Block Address Area-1 | ECC Area-1 |

FIG. 4

PRIOR ART

|  |  | 0 | 511 | 512 | 527 |
|---|---|---|---|---|---|
| PHYSICAL BLOCK 0 | Page 0 | DATA AREA | | REDUNDANT DIVISION (16BYTES) | |
| | Page 1 | | | | |
| | ⋮ | | | | |
| | Page 15 | | | | |
| PHYSICAL BLOCK 1 | Page 0 | | | | |
| | Page 1 | | | | |
| | ⋮ | | | | |
| | Page 15 | | | | |
| ⋮ | ⋮ | ⋮ | | ⋮ | |
| PHYSICAL BLOCK 1023 | Page 0 | | | | |
| | Page 1 | | | | |
| | ⋮ | | | | |
| | Page 15 | | | | |

FIG. 5

PRIOR ART

| | | |
|---|---|---|
| LOGICAL BLOCK 0 | SECTOR 0 | 512 BYTES |
| | SECTOR 1 | |
| | ⋮ | |
| | SECTOR 15 | |
| LOGICAL BLOCK 1 | SECTOR 16 | |
| | SECTOR 17 | |
| | ⋮ | |
| | SECTOR 31 | |
| ⋮ | ⋮ | ⋮ |
| LOGICAL BLOCK 999 | SECTOR 15984 | |
| | SECTOR 15985 | |
| | ⋮ | |
| | SECTOR 15999 | |

FIG.6

PRIOR ART

DATA DIVISION

| BYTE | |
|---|---|
| 0~511 | DATA Area |

REDUNDANT DIVISION

| BYTE | |
|---|---|
| 512 | User Data Area |
| 513 | |
| 514 | |
| 515 | |
| 516 | Data Status Area |
| 517 | Block Status Area |
| 518 | Block Address Area-1 |
| 519 | |
| 520 | ECC Area-2 |
| 521 | |
| 522 | |
| 523 | Block Address Area-2 |
| 524 | |
| 525 | ECC Area-1 |
| 526 | |
| 527 | |

FIG. 7

PRIOR ART

| OFFSET (LOGICAL BLOCK ADDRESS) | PHYSICAL BLOCK ADDRESS | PHYSICAL BLOCK ADDRESS (BINARY DATA) | |
|---|---|---|---|
| | | UPPER BYTE | LOWER BYTE |
| word0 (LBA=0) | 0 | 0000 0000 | 0000 0000 |
| word1 (LBA=1) | 500 | 0000 0001 | 1111 0100 |
| word2 (LBA=2) | 327 | 0000 0001 | 0100 0111 |
| ⋮ | ⋮ | ⋮ | ⋮ |
| word497 (LBA=497) | 244 | 0000 0000 | 1111 0100 |
| word498 (LBA=498) | 249 | 0000 0001 | 1110 1111 |
| word499 (LBA=499) | 128 | 0000 0001 | 1000 0000 |

FIG. 9
PRIOR ART

| OFFSET (LOGICAL BLOCK ADDRESS) | PHYSICAL BLOCK ADDRESS | PHYSICAL BLOCK ADDRESS (BINARY DATA) | |
|---|---|---|---|
| | | UPPER BYTE | LOWER BYTE |
| word0 (LBA=0) | 0 | 0000 0000 | 0000 0000 |
| word1 (LBA=1) | 1000 | 0000 0011 | 1110 1000 |
| word2 (LBA=2) | 654 | 0000 0010 | 1000 1110 |
| ⋮ | ⋮ | ⋮ | ⋮ |
| word997 (LBA=997) | 488 | 0000 0001 | 1110 1000 |
| word998 (LBA=998) | 498 | 0000 0001 | 1111 0010 |
| word999 (LBA=999) | 256 | 0000 0001 | 0000 0000 |

FIG. 10
PRIOR ART

| D7 | D6 | D5 | D4 | D3 | D2 | D1 | D0 | 256 + 8 BYTE/PAGE |
|---|---|---|---|---|---|---|---|---|
| 0 | 0 | 0 | 1 | BA10 | BA9 | BA8 | BA7 | 262 BYTE (EVEN PAGE)<br>259 BYTE (ODD PAGE) |
| BA6 | BA5 | BA4 | BA3 | BA2 | BA1 | BA0 | P | 263 BYTE (EVEN PAGE)<br>260 BYTE (ODD PAGE) |

BA10~BA0: LOGICAL BLOCK ADDRESS
P EVEN PARITY BIT "1" FIXED VALUE

FIG. 11
PRIOR ART

MANAGEMENT AREA

| File-1 | |
| File-2 | |
| File-3 | |
| File-4 | |
| ⋮ | |
| File-N | |

File-1, File-4 ERASE →

MANAGEMENT AREA

| File-1 | del Mark |
| File-2 | |
| File-3 | |
| File-4 | del Mark |
| ⋮ | |
| File-N | |

DATA AREA

| File-1 |
| File-2 |
| File-3 |
| File-4 |
| ⋮ |
| File-N |

DATA AREA

| File-1 |
| File-2 |
| File-3 |
| File-4 |
| ⋮ |
| File-N |

FIG. 16
PRIOR ART

| 1,10,11 | Vss | POWER SUPPLY(GND) |
| --- | --- | --- |
| 2 | CLE | COMMAND LATCH ENABLE |
| 3 | ALE | ADDRESS LATCH ENABLE |
| 4 | $\overline{WE}$ | WRITE ENABLE |
| 5 | $\overline{WP}$ | WRITE PROTECT |
| 6-9 | $I/O_{1-4}$ | ADDRESS DATA COMMAND INPUT-OUTPUT PORT |
| 13-16 | $I/O_{5-8}$ | ADDRESS DATA COMMAND INPUT-OUTPUT PORT |
| 17 | NC | N_C |
| 18 | GND | GND LEVEL INPUT |
| 19 | R/$\overline{B}$ | READY BUSY OUTPUT |
| 20 | $\overline{RE}$ | READ ENABLE |
| 21 | $\overline{CE}$ | CHIP ENABLE |
| 22,23 | Vcc | POWER SUPPY |

5V PRODUCT 3.3V PRODUCT

5V PRODUCT 3.3V PRODUCT

5V DEDICATED CONNECTOR

3.3V DEDICATED CONNECTOR

|  | bit7 | bit6 |  | bit1 | bit0 |
|---|---|---|---|---|---|
| 1stByte | 00000000 111 | 00000000 110 |  | 00000000 001 | 00000000 000 |
| 2ndByte | 00000000 111 | 00000001 110 |  | 00000001 001 | 00000001 000 |
| ⋮ | ⋮ | ⋮ | ⋮⋮⋮⋮ | ⋮ | ⋮ |
| 255thByte | 11111110 111 | 11111110 110 |  | 11111110 001 | 11111110 000 |
| 266thByte | 11111111 111 | 11111111 110 |  | 11111111 001 | 11111111 000 |

| OFFSET (LOGICAL BLOCK ADDRESS) | PHYSICAL BLOCK AREA ADDRESS | PHYSICAL BLOCK AREA ADDRESS (BINARY DATA) | |
|---|---|---|---|
| Word0(LBA=0) | 0 | 0 0 0 0 | 0 0 0 0 |
| Word1(LBA=1) | 250 | 1 1 1 1 | 1 0 1 0 |
| Word2(LBA=2) | 163 | 1 0 1 0 | 0 0 1 1 |
| ⋮ | ⋮ | ⋮ | ⋮ |
| Word497(LBA=497) | 122 | 0 1 1 1 | 1 0 1 0 |
| Word498(LBA=498) | 248 | 1 0 1 0 | 1 0 0 0 |
| Word499(LBA=499) | 64 | 0 1 0 0 | 0 0 0 0 |

1 PHYSICAL BLOCK AREA = 2 PHYSICAL BLOCK

FIG. 34

| OFFSET (LOGICAL BLOCK ADDRESS) | (PHYSICAL BLOCK ADDRESS) | |
|---|---|---|
| | Upper Byte | Lower Byte |
| Word0 (LBA=0) | Physical Block Upper Address | Physical Block Lower Address |
| Word1 (LBA=1) | Physical Block Upper Address | Physical Block Lower Address |
| Word2 (LBA=2) | Physical Block Upper Address | Physical Block Lower Address |
| ⋮ | | |
| Word247 (LBA=247) | Physical Block Upper Address | Physical Block Lower Address |
| Word248 (LBA=248) | Physical Block Upper Address | Physical Block Lower Address |
| Word249 (LBA=249) | Physical Block Upper Address | Physical Block Lower Address |

FIG.42(a)

| OFFSET (LOGICAL BLOCK ADDRESS) | (PHYSICAL BLOCK ADDRESS) | |
|---|---|---|
| | Upper Byte | Lower Byte |
| Word0 (LBA=250) | Physical Block Upper Address | Physical Block Lower Address |
| Word1 (LBA=251) | Physical Block Upper Address | Physical Block Lower Address |
| Word2 (LBA=252) | Physical Block Upper Address | Physical Block Lower Address |
| ⋮ | | |
| Word247 (LBA=497) | Physical Block Upper Address | Physical Block Lower Address |
| Word248 (LBA=498) | Physical Block Upper Address | Physical Block Lower Address |
| Word249 (LBA=499) | Physical Block Upper Address | Physical Block Lower Address |

FIG.42(b)

| OFFSET (LOGICAL BLOCK ADDRESS) | PHYSICAL BLOCK ADDRESS | PHYSICAL BLOCK ADDRESS (BINARY DATA) | | |
|---|---|---|---|---|
| Word0 (LBA=0) | 0 | 0000 | 0000 | 0000 |
| Word2 (LBA=2) | 227 | 0000 | 1110 | 0011 |
| ⋮ | ⋮ | ⋮ | ⋮ | ⋮ |
| Word254 (LBA=254) | 244 | 0000 | 1111 | 0100 |
| Word255 (LBA=255) | 128 | 0000 | 1000 | 0111 |
| Word256 (LBA=256) | 256(256-256=0) | 0000 | 0000 | 0000 |
| Word257 (LBA=257) | 327(327-256=71) | 0000 | 0100 | 0111 |
| ⋮ | ⋮ | ⋮ | ⋮ | ⋮ |
| Word499 (LBA=499) | 500(500-256=244) | 0000 | 1110 | 0000 |
| Word500 (LBA=500) | 428(428-256=172) | 0000 | 1010 | 1100 |

Rows 1–5: ZONE 1. Rows 6–10: ZONE 2.

FIG. 45

BEFORE REPLACEMENT OF BLOCK

PHYSICAL BLOCK ADDRESS

| | | |
|---|---|---|
| | 0 | Block0 data area |
| | 1 | Block1 data area |
| NG ZONE 1 | 2 | Block2 data area |
| | 3 | Block3 data area |
| | 4 | Block4 data area |
| | 5 | Block5 data area |
| NG | 6 | Block6 data area |
| | ⋮ | ⋮ |
| NG ZONE 2 | 128 | Block128 data area |
| | 129 | Block129 data area |
| | 130 | Block130 data area |
| NG | 131 | Block131 data area |
| NG | 132 | Block132 data area |
| | 133 | Block133 data area |
| | ⋮ | ⋮ |
| ZONE 3 | 256 | Block256 data area |
| | 257 | Block257 data area |
| | 258 | Block258 data area |
| | 259 | Block259 data area |
| | 260 | Block260 data area |
| | 261 | Block261 data area |
| | 262 | Block262 data area |
| | ⋮ | ⋮ |
| ZONE 4 | 384 | Block384 data area |
| NG | 385 | Block385 data area |
| | 386 | Block386 data area |
| | 387 | Block387 data area |
| | 388 | Block388 data area |
| NG | 389 | Block389 data area |
| | ⋮ | ⋮ |

REDUNDANT BLOCK

| | |
|---|---|
| | |
| | |
| | |

AFTER REPLACEMENT OF BLOCK

PHYSICAL BLOCK ADDRESS

| | | |
|---|---|---|
| ZONE 1 | 0 | Block0 data area |
| | 1 | Block1 data area |
| | 2 | ~~Block2 data area~~ |
| | 3 | Block3 data area |
| | 4 | Block4 data area |
| | 5 | ~~Block5 data area~~ |
| | 6 | Block6 data area |
| | ⋮ | ⋮ |
| ZONE 2 | 128 | Block128 data area |
| | 129 | ~~Block129 data area~~ |
| | 130 | Block130 data area |
| | 131 | ~~Block131 data area~~ |
| NG | 132 | Block132 data area |
| | 133 | Block133 data area |
| | ⋮ | ⋮ |
| ZONE 3 | 256 | Block256 data area |
| | 257 | Block257 data area |
| | 258 | Block258 data area |
| | 259 | Block259 data area |
| | 260 | Block260 data area |
| | 261 | Block261 data area |
| | 262 | Block262 data area |
| | ⋮ | ⋮ |
| ZONE 4 | 384 | Block384 data area |
| NG | 385 | Block385 data area |
| | 386 | Block386 data area |
| | 387 | Block387 data area |
| | 388 | Block388 data area |
| NG | 389 | Block389 data area |
| | ⋮ | ⋮ |

REDUNDANT BLOCK

| | |
|---|---|
| 2 | Block2 data area |
| 5 | Block5 data area |
| 129 | Block129 data area |
| 131 | Block131 data area |

FIG. 46

BEFORE REPLACEMENT OF BLOCK

| | PHYSICAL BLOCK ADDRESS | |
|---|---|---|
| | 0 | Block0 data area |
| | 1 | Block1 data area |
| NG ZONE 1 | 2 | Block2 data area |
| | 3 | Block3 data area |
| | 4 | Block4 data area |
| NG | 5 | Block5 data area |
| NG | 6 | Block6 data area |
| | ⋮ | ⋮ |
| NG ZONE 2 | 128 | Block128 data area |
| | 129 | Block129 data area |
| | 130 | Block130 data area |
| NG | 131 | Block131 data area |
| NG | 132 | Block132 data area |
| | 133 | Block133 data area |
| | ⋮ | ⋮ |
| ZONE 3 | 256 | Block256 data area |
| | 257 | Block257 data area |
| | 258 | Block258 data area |
| | 259 | Block259 data area |
| | 260 | Block260 data area |
| | 261 | Block261 data area |
| | 262 | Block262 data area |
| | ⋮ | ⋮ |
| | 384 | Block384 data area |
| NG ZONE 4 | 385 | Block385 data area |
| | 386 | Block386 data area |
| | 387 | Block387 data area |
| | 388 | Block388 data area |
| NG | 389 | Block389 data area |
| | ⋮ | ⋮ |

REDUNDANT BLOCK

| | |
|---|---|
| | |
| | |
| | |

AFTER REPLACEMENT OF BLOCK

| | PHYSICAL BLOCK ADDRESS | |
|---|---|---|
| | 0 | Block0 data area |
| | 1 | Block1 data area |
| ZONE 1 | 2 | ~~Block2 data area~~ |
| | 3 | Block3 data area |
| | 4 | Block4 data area |
| NG | 5 | Block5 data area |
| NG | 6 | Block6 data area |
| | ⋮ | ⋮ |
| ZONE 2 | 128 | Block128 data area |
| | 129 | ~~Block129 data area~~ |
| | 130 | Block130 data area |
| | 131 | ~~Block131 data area~~ |
| NG | 132 | Block132 data area |
| | 133 | Block133 data area |
| | ⋮ | ⋮ |
| ZONE 3 | 256 | Block256 data area |
| | 257 | Block257 data area |
| | 258 | Block258 data area |
| | 259 | Block259 data area |
| | 260 | Block260 data area |
| | 261 | Block261 data area |
| | 262 | Block262 data area |
| | ⋮ | ⋮ |
| ZONE 4 | 384 | Block384 data area |
| | 385 | ~~Block385 data area~~ |
| | 386 | Block386 data area |
| | 387 | Block387 data area |
| | 388 | Block388 data area |
| NG | 389 | Block389 data area |
| | ⋮ | ⋮ |

REDUNDANT BLOCK

| 129 | Block129 data area |
|---|---|
| 131 | Block131 data area |
| 2 | Block2 data area |
| 385 | Block385 data area |

FIG. 48

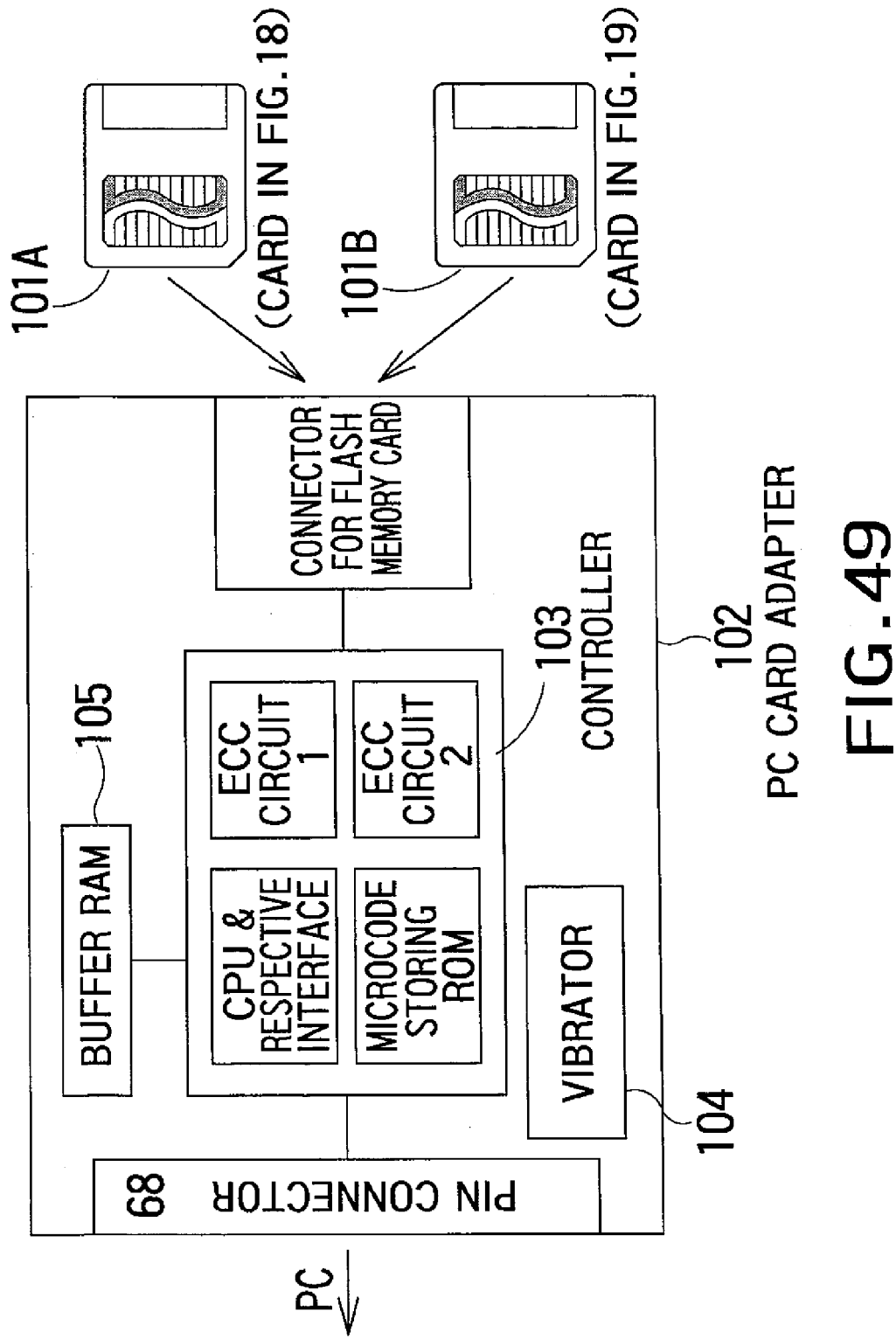

DATA DIVISION

| BYTE | PAGE 0 (EVEN PAGE) | PAGE 1 (ODD PAGE) |
|---|---|---|
| 0~255 | DATA Area-1 | DATA Area-2 |

REDUNDANT DIVISION

| BYTE | EVEN PAGE | ODD PAGE |
|---|---|---|
| 256 | ECC Flag Area | ECC Area-2 |
| 257 | ECC Area-3 | ECC Area-2 |
| 258 | ECC Area-3 | ECC Area-2 |
| 259 | ECC Area-3 | Block Address Area-2 |
| 260 | Data Status Area | Block Address Area-2 |
| 261 | Block Status Area | ECC Area-1 |
| 262 | Block Address Area-1 | ECC Area-1 |
| 263 | Block Address Area-1 | ECC Area-1 |

FIG. 51

|  | ECC-AREA1 | ECC-AREA2 | ECC-AREA3 | ECC-AREA4 |
| --- | --- | --- | --- | --- |
| ECC METHOD 1 | ECC CODE FOR DATA AREA-1 | ECC CODE FOR DATA AREA-2 | NULL (ALL "FFh") | ECC1-FLAG |
| ECC METHOD 2 | ECC CODE FOR DATA AREA-1,2 | ECC CODE FOR DATA AREA-1,2 | ECC CODE FOR DATA AREA-1,2 | ECC2-FLAG |

FIG.52

METHOD FOR CONTROLLING NON-VOLATILE SEMICONDUCTOR MEMORY SYSTEM

RELATED APPLICATION

This is a continuation of divisional application Ser. No. 10/913,865, filed Aug. 6, 2004, which is a divisional of application Ser. No. 09/130,818, filed Aug. 7, 1998, now U.S. Pat. No. 6,845,438 which application is hereby incorporated in its entirety. Parent application Ser. No. 09/130,818 claimed priority under 35 U.S.C. §119 from Japanese patent application Serial No. 214561/1997 filed Aug. 8, 1997 and Japanese patent application Serial No. 119099/1998 filed Apr. 28, 1998. The present divisional application claims priority from these Japanese applications under 35 U.S.C. §§119-120.

BACKGROUND OF THE INVENTION

1. Field of The Invention

The present invention relates generally to a method for controlling a memory system. More specifically, the invention relates to a method for controlling a non-volatile semiconductor memory system, such as a non-volatile semiconductor memory card.

2. Related Background Art

In recent years, a flash memory card like that shown in FIG. 1 has widely used as a storage medium for a portable information apparatus, such as a digital still camera or a PDA. NAND-type flash memories have been used and sold.

As shown in FIG. 1, a flash memory card of this type has a thin plastic package 1 having a slightly recessed portion, in which a flash memory 2 having a flat electrode with 22 pins is mounted. This flash memory card is electrically connected to a host system via a dedicated connector to input and output data.

FIG. 2 shows, as an example of a flash memory, a 16-Mbit NAND-type flash memory divided into 512 physical memory blocks. Each of these blocks is a minimum unit for an erase operation. One block is divided into 16 pages. One page is a basic unit of writing and read-out. One page comprises 264 bytes. Among the 264 bytes, 256 bytes are a user data area (data division), and the remaining 8 bytes (redundant division) are used for storing an error correcting code and a management information service.

On the other hand, personal computers manage data as logical blocks shown in FIG. 3. Five hundred logical blocks (identified by logical block address (LBA)), are set in FIG. 3. One logical block corresponds to 8 continuous sectors. That is, logical block 0 means logical sectors 0 to 7.

In ordinary personal computers, data are managed every sector (512 bytes). Therefore, the memory card stores therein data of one sector of a logical block using 2 pages of a physical block as a pair to carry out data management in units of 512 bytes. FIG. 4 shows an exemplary data storing method.

Unused normal blocks of both of the data division and redundant division are set to be "FFh". The meanings of the respective bytes will be described below. Data Area-1 stores the first half 0 to 255 bytes of the data of 512 bytes. Data Area-2 stores the second half 256 to 511 bytes of the data of 512 bytes. The User Data Area is open to store user data, so that the use thereof is entrusted to the user. A Data Status Area indicates whether data are presumed reliable. Although an "FFh" is usually set, a "00h" is set when defective data are written (e.g., when the desired threshold voltage for the memory cell cannot be achieved or another error condition is associated with the cell). A Block Status Area indicates whether a block is good or defective. Although the "FFh" is usually set, the "00h" (initial defective block) or an "F0h" (acquired defective block) is set in the case of a defective block. Furthermore, the same value is written in the Block Status Area for all data in one block. A Block Address Area-1 indicates a logical address information of a block. Furthermore, since 8 sectors forming one logical block correspond to one of 512 physical blocks, the same values for all the data are written in the same block. Similarly, in a Block Address Area-2, the same contents as the data of the Block Address Area-1 are written. An ECC Area-1 is a 3-byte ECC code of even page data (256 bytes). An ECC Area-2 is a 3-byte ECC code of odd page data (256 bytes).

FIG. 5 shows, as another example of a flash memory, a 64-Mbit NAND-type flash memory that is divided into 1024 physical memory blocks. Each of these blocks is a minimum unit of erase. One block is divided into 16 pages. One page is a basic unit of writing and read-out. One page comprises 528 bytes. Among the 528 bytes, 512 bytes are used for a user data area (data division), and the remaining 16 bytes (redundant division) are used for storing an error correcting code and a management information service. One thousand logical blocks are set in FIG. 6. One logical block corresponds to 16 continuous sectors. That is, logical block 0 includes logical sectors 0 to 15. FIG. 7 shows a method for storing data in the 64-Mbit NAND-type flash memory.

The control of such a memory card adopts an additional writing system for writing updated data in a previously erased area when data are updated and subsequently erasing an area in which the original data were stored. Therefore, a physical block, in which data corresponding to a certain logical block exist, is not fixed and is always moving in the memory. Also, as shown in FIG. 8, the redundant division of the physical block stores therein a logical block address information indicating which logical block corresponds to the data held in the physical block. The Block Address Area-1 and the Block Address Area-2 in FIGS. 4 and 7 correspond to the corresponding logical addresses.

Therefore, the memory system searches areas for storing the logical block address information of all the physical blocks to prepare a translation table between logical blocks and physical blocks on a system RAM, usually when a power supply is turned on. After the tables are prepared once, it is possible to immediately determine the physical block corresponding to the logical block by referring to the tables. The searching operation for all the blocks is carried out once when the power supply is turned on. Naturally, if the position of the corresponding physical block changes after the data are updated, the memory system updates a logical address/physical address translation table to get ready for the next access.

However, in conventional memory systems, there is a first problem in that the RAM area required for the logical address/physical address translation table is large. The contents thereof will be described in detail below.

FIG. 9 shows a logical address/physical address translation table of a conventional 16-Mbit NAND-type flash memory. As described above, the data of one logical block, i.e., the data of 8 continuous sectors, exist in any one of 512 physical blocks in the flash memory. In order to select one block from the 512 physical blocks, 9 bits are required. If the table is formed so that an offset logical block address directly indicates a physical block for convenience of a software, 2 bytes are required for one logical block, so that a RAM area of 1 KB in total is required. For example, the address of a physical block, in which the information of logical block 5 is stored, is an address offset by 5 words (10 bytes) from the top of the table.

Thus, in the conventional method, there is a problem in that the RAM area required for the logical address/physical address translation table is very large. In general, a general purpose CPU has a RAM of about 1 KB on board as an integrated RAM. Therefore, conventionally, the logical address/physical address translation table must use 1 KB, and system configuration requires more than the integrated RAM, so that an external RAM must be provided for the system. This is a great factor in an increase in costs.

FIG. 10 shows a logical address/physical address translation table of a conventional 64-Mbit NAND-type flash memory. In this case, the data of one logical block, i.e., the data of 16 continuous sectors, exist in any one of 1024 physical blocks in the flash memory. The selection of one physical block from 1024 physical blocks needs 10 bits, so that a RAM area of 2 KB in total is required. For that reason, a very large RAM area is required similar to the 16-bit NAND-type flash memory.

This problem is more serious as the capacity of the flash memory increases. For example, the number of blocks is 8192 for the 1-Gbit capacity memories, so that a RAM capacity of 16 KB is required.

If the memory capacity increases more, there is a second problem in that the logical address can not be stored in the redundant division of the physical block of the flash memory. The Block Address Area of the redundant division of a physical block of the 16-Mbit NAND-type flash memory shown in FIG. 7 stores therein a logical block address information indicating which logical block corresponds to the data held in the physical block. FIG. 11 shows the structure of the Block Address Area of the redundant division of each physical block. In FIG. 11, four bits of D4 through D7 of a number 262 byte of an even page and a number 259 byte of an odd page are "0", "0", "0" and "1", and one bit of D0 of a number 263 byte of an even page and a number 260 byte of an odd page has a fixed value "1". Therefore, the maximum value of a block address capable of being stored is 2047 expressed by BA0 through BA10. Since 4096 physical blocks exist in a 512-Mbit NAND-type flash memory, it is not possible to store the address unless the description method for the Block Address Area is changed. Since the method for controlling the redundant division is different from those for conventional flash memories, it is not possible to control a high-capacity flash memory unless the host prepares two kinds of programs. This is a problem in that there is insufficient capacity in the program storing area of the host system for the necessary programs.

The writing and erase for a flash memory will be briefly described below. The writing in a flash memory is carried out page by page. In the case of a 64-Mbit NAND-type EEPROM, one page has 528 bytes. In addition, erase is carried out in units of a block. In the case of the 64-Mbit NAND-type EEPROM, one block is formed by 16 pages. Thus, in the NAND EEPROM, the unit of writing is different from the unit of erase. Therefore, it is not possible to erase only a certain page to update data.

When a flash memory card is used for a personal computer, it is generally treated as a drive under the control of the DOS. Parts (a) and (b) of FIG. 12 show conventional DOS format parameters, wherein part (a) shows the parameters in the case of a cluster size of 4 KB and part (b) shows the parameters in the case of a cluster size of 8 KB. The term "cluster" means a basic minimum unit of file management on the DOS. Even when a small file is stored, the file occupies one cluster. When the file size is large, the file is managed as a chain of a plurality of clusters, and its management information service is stored in a FAT (file allocation table). The size of the cluster, the management method for the FAT and so forth are managed in a sector called a boot sector. When one device is managed as a plurality of drives, its information is stored in a master boot sector. In order to carry out the writing in a file, the OS issues a write command for each cluster.

Part (a) of FIG. 12 shows the case of a cluster size of 4 KB. A master boot sector is arranged in logical sector 0, and a boot sector is arranged in logical sector 16. In addition, FATs are arranged in logical sectors 17 through 22, and the copies of the FATs are arranged in logical sectors 23 through 28. Moreover, directories are arranged in logical sectors 29 through 44, and file data areas are arranged in and after logical sector 45.

Part (b) of FIG. 12 shows the case of cluster size of 8 KB. A master boot sector is arranged in logical sector 0, and a boot sector is arranged in logical sector 16. In addition, FATs are arranged in logical sectors 17 through 19, and the copies of the FATs are arranged in logical sectors 20 through 22. Moreover, directories are arranged in logical sectors 23 through 38, and file data areas are arranged in and after logical sector 39.

Referring to FIG. 13, a conventional rewrite sequence in the case of a cluster size of 4 KB will be described. Since the cluster size is 4 KB, a write command for continuous 8 sectors is issued from the OS. At this time, the writing (data update) in logical sectors 45 through 52 (cluster A) is carried out.
(1) An erased new area is searched, and logical sectors 32 through 44 are copied on the new area NAND Block C from the original block.
(2) The new data of logical sectors 45 through 47 are written in the new area NAND Block C.
(3) The original block NAND Block A is erased.
(4) The logical address/physical address translation table is updated.
(5) An erased new area is searched, and the new data of logical sectors 48 through 52 are written in the new area NAND Block D.
(6) The data of logical sectors 53 through 63 of the original block NAND Block B are copied on the new area NAND Block D.
(7) The original block NAND Block B is erased.
(8) The logical address/physical address translation table is updated.

Therefore, when 8 sectors are rewritten, as viewed from the outside, logical sectors 32 through 63, i.e., 32 sectors in total (32 pages) are written, and the NAND Block A and the NAND Block B, i.e., 2 blocks in total, are erased within the actual device.

Referring to FIG. 14, a writing sequence in cluster B will be described below. In this case, the writing (data update) in logical sectors 53 through 60 (cluster B) is carried out.
(1) An erased new area is searched, and logical sectors 48 through 52 are copied on the new area NAND Block C from the original block NAND Block B.
(2) The new data of logical sectors 53 through 60 are written in the new area NAND Block C.
(3) Logical sectors 61 through 63 are copied on the new area NAND Block C from the original block NAND Block B.
(4) The original block NAND Block B is erased.
(5) The logical address/physical address translation table is updated.

Therefore, when 8 sectors are rewritten, as viewed from the outside, logical sectors 48 through 63, i.e., 16 sectors in total (16 pages), are written and the NAND Block A, i.e., one block, is erased within the actual device.

Referring to FIG. 15, a conventional rewriting sequence in the case of a cluster size of 8 KB will be described. Since the cluster size is 8 KB, a write command for 16 continuous sectors is issued from the OS. At this time, the writing (data update) in logical sectors 39 through 54 (cluster A) is carried out.

(1) An erased new area is searched, and logical sectors 32 through 38 are copied on the new area NAND Block C from the original block NAND Block A.
(2) The new data of logical sectors 39 through 47 are written in the new area NAND Block C.
(3) The original block NAND Block A is erased.
(4) The logical address/physical address translation table is updated.
(5) An erased new area is searched, and the new data of logical sectors 48 through 54 are written in the new area NAND Block D.
(6) The data of logical sectors 55 through 63 of the original block NAND Block B are copied on the new area NAND Block D.
(7) The original block NAND block B is erased.
(8) The logical address/physical address translation table is updated.

Therefore, when 16 sectors are rewritten if viewed from the outside, the write operation in logical sectors 32 through 63, i.e., 32 sectors in total (32 pages), and the erase operation from the NAND Block A and the NAND Block B, i.e., 2 blocks in total, are carried out in an actual device.

Comparing the cluster of 4 KB with the cluster of 8 KB when the same 8 KB data are written, in the case of the cluster size of 4 KB, the processing is divided into two write operations, so that the write operation consists of 48 sectors in total and an erase operation for three blocks is carried out. On the other hand, comparing with the cluster size of 8 KB in the case of the cluster size of 8 KB, the processing is concentrated on one writing, so that the write operation consists of 32 sectors in total and an erase operation for two blocks is carried out.

Thus, in the conventional memory system, when viewed from the outside, the number of the write and erase operations actually executed in the device is far greater than the number of updated sectors, so that there is the second problem in that the rewriting speed viewed from the outside decreases.

The operation of the conventional memory system when executing a file erase command will be described below. In an ordinary DOS file system, when the file erase command is executed, a mark indicating that a corresponding file is invalid is put on a directory, and a memory area having been occupied by the corresponding file is identified as open on a FAT (file allocation table). Therefore, the data division of the file body remains on the flash memory without being erased. FIG. 16 shows the relationship between a management area and a data area when an erase command is executed. In FIG. 16, for example, when erase commands for File-1 and File-4 are executed, the File-1 and File-4 are open, and a del.mark is stored. At this time, the File-1 and the File-4 are not erased from the data area.

For that reason, when a subsequent write command is executed, it is first required to carry out the erase operation of the flash memory when a data division of a new file is written in the open area. Consequently, the erase operation of the flash memory must be always carried out when the file writing is carried out, so that there is a third problem in that the file writing speed deteriorates.

The ECC Area-1 shown in FIG. 4 is a 3-byte ECC code of an even page data (256 bytes). The ECC Area-2 is a 3-byte ECC code of an odd page data (256 bytes).

The ECC (error correcting code) means a code for correcting an error. The system utilizes this error correcting code to determine whether a read data has an error. When an error exists, the system can correct the error. The required error correcting capability depends on the reliability of the flash memory itself, e.g., the cell structure of the memory. Flash memories have a plurality of data storing methods. When these flash memories are used for a system, such as a digital still camera and a PDA, error correction will be considered.

For example, a first flash memory card holds binary values "0" and "1" corresponding to the different threshold values of a memory cell shown in FIG. 17. The memory card can therefore use a 1-bit error correcting code to provide ECC for one page (256 bytes). A second flash memory card holds four-valued values "00", "01", "10" and "11" (2 bits) corresponding to the multiple values of the threshold of a memory cell shown in FIG. 18. The memory card that stores multiple bits per cell, illustrated in FIG. 18, therefore uses a 2-bit error correcting code to provide ECC for one page (256 bytes) since there is a possibility that 2-bit data may be erroneous when one memory cell is defective. The algorithm for generating a code and detecting and correcting an error for 1-bit error correction is different from that for 2-bit error correction.

Conventional systems (e.g., digital still cameras, PDAs) have only one kind of error correcting algorithm on board. For that reason, there is a fourth problem in that it is possible to read only one of the above described first (single bit) and second (multi-bit storage per cell) memory cards. This is an obstacle to the enhancement of flexibility of flash memories on the market.

SUMMARY OF THE INVENTION

It is therefore an object of the present invention to eliminate the aforementioned problems and to provide a method for controlling a memory system, which improve the stability of operation when the insertion/ejection of a memory card is carried out.

It is another object of the present invention to provide a method for reducing the capacity of a RAM required for a logical address/physical address translation table to control a flash memory by means of only an integrated RAM of a general purpose CPU, thereby dispensing with an external RAM, which has been conventionally required, to considerably reduce costs.

It is another object of the present invention to provide a method for controlling a memory system so as to prevent the delimiter of a cluster serving as a basic unit of file management on the DOS from straddling a block serving as a unit of erase, thereby providing a high-speed data writing.

It is a further object of the present invention to open a management area for a physical block while erasing its data area when an erase command is executed, thereby improving a processing speed when a subsequent write command is executed.

It is a still further object of the present invention to provide a system capable of supporting any one of two kinds of flash memories, such as binary/multi-valued flash memories, or a plurality of flash memories.

In order to accomplish the aforementioned and other objects, according to the present invention, there is provided a method for controlling a memory system, which uses the terminals of a connector sequentially connected to the terminals of a memory card (a storage medium), which is disclosed in Japanese Patent Laid-Open Nos. 8-90969 and 8-202509.

According to a first aspect of the present invention, there is provided a method for controlling a memory system using a storage medium, which is inserted into an electronic apparatus via a connector to add a memory function thereto, said storage medium having ground terminals, power supply terminals, control terminals and data input/output terminals, said connector having a function of being sequentially connected to each of said terminals, wherein when said storage medium is inserted into said connector, said ground terminals and control terminals of said storage medium are connected to corresponding terminals of said connector before said power supply terminals and data input/output terminals of said storage medium are connected to corresponding terminals of said connector.

According to a second aspect of the present invention, there is provided a method for controlling a memory system using a storage medium, which is inserted into an electronic apparatus via a connector to add a memory-function thereto, said storage medium having ground terminals, power supply terminals, control terminals and data input/output terminals, said connector having a function of being sequentially disconnected from each of said terminals wherein when said storage medium is ejected from said connector, said power supply terminals and data input/output terminals of said storage medium are disconnected from corresponding terminals of said connector before said ground terminals and control terminals of said storage medium are disconnected from corresponding terminals of said connector.

According to a third aspect of the present invention, there is provided a method for controlling a memory system using a storage medium, which is inserted into an electronic apparatus via a connector to add a memory function thereto, said storage medium having ground terminals, power supply terminals, a first control terminal, a second control terminal and data input/output terminals, said connector having a function of being sequentially connected to each of said terminals, wherein when said storage medium is inserted into said connector, said ground terminals and first control terminals of said storage medium are connected to corresponding terminals of said connector before said power supply terminals and data input/output terminal of said storage medium are connected to corresponding terminals of said connector, and said second control terminal being connected to a corresponding terminal of said connector before said data input/output terminals are connected to a corresponding terminal of said connector.

According to a fourth aspect of the present invention, there is provided a method for controlling a memory system using a storage medium, which is inserted into an electronic apparatus via a connector to add a memory function thereto, said storage medium having ground terminals, a power supply terminals, a first control terminal, a second control terminal and data input/output terminals, said connector having a function of being sequentially connected to each of said terminals, wherein when said storage medium is ejected from said connector, said data input/output terminals are disconnected from corresponding terminals of said connector before said second control terminal is disconnected from a corresponding terminal of said connector, and said power supply terminals and data input/output terminals of said storage medium being disconnected from corresponding terminals of said connector before said ground terminals and first control terminal of said storage medium are disconnected from corresponding terminals of said connector.

According to a fifth aspect of the present invention, there is provided a method for controlling a memory system having a storage medium, which is inserted into an electronic apparatus via a connector to add a memory function thereto, said storage medium having ground terminals, power supply terminals, first control terminal, a second control terminal data input/output terminals and an insertion/ejection detecting terminal, said connector having a function of being sequentially connected to each of said terminals, wherein when said storage medium is inserted into said connector, said ground terminals and first control terminals of said storage medium are connected to corresponding terminals of said connector before said power supply terminals and data input/output terminals of said storage medium are connected to corresponding terminals of said connector, said second control terminal of said storage medium being connected to a corresponding terminal of said connector before said data input/output terminals of said storage medium are connected to corresponding terminals of said connector, and said insertion/ejection detecting terminal being connected to a corresponding terminal of said connector after all of said terminals of said storage medium are inserted.

According to a sixth aspect of the present invention, there is provided a method for controlling a memory system having a storage medium which is inserted into an electronic apparatus via a connector to add a memory function thereto, said storage medium having ground terminals, power supply terminals, a first control terminal, a second control terminal data input/output terminals and an insertion/ejection detecting terminal, said connector having a function of being sequentially connected to each of said terminals, wherein when said storage medium is ejected from said connector, said insertion/ejection detecting terminal is disconnected from a corresponding terminal of said connector before said data input/output terminals of said storage medium are disconnected from corresponding terminals of said connector, said data input/output terminals of said storage medium being disconnected from corresponding terminals of said connector before said power supply terminals and second control terminal of said storage medium are disconnected from corresponding terminals of said connector, and said power supply terminals of said storage medium being disconnected from corresponding terminals of said connector before said ground terminals and first control terminal of said storage medium are disconnected from corresponding terminals of said connector.

According to a seventh aspect of the present invention, there is provided a method for controlling a memory system which includes:

logical blocks managed by the system; physical blocks for storing therein data corresponding to said logical blocks, said physical blocks comprising a plurality of memory cells; redundant divisions included in a corresponding said physical blocks for storing therein addresses of corresponding said logical blocks; and physical block areas formed by at least two of said physical blocks, wherein a logical address/physical address translation table is prepared for managing corresponding relationships between said logical blocks and said physical blocks.

According to an eighth aspect of the present invention, there is provided a method for controlling a memory system, which is a semiconductor memory system for storing a file managed according to predetermined units, in a storage area divided into second predetermined units.

According to a ninth aspect of the present invention, there is provided a method for controlling a memory system which includes:

files managed by the system; data areas for storing therein the contents of said files; and management areas for storing therein a corresponding relationships between said files and said data areas, wherein when said file is erased, it is marked that said data areas corresponding to said management areas are empty area, to erase said corresponding data areas.

According to a tenth aspect of the present invention, there is provided a method for controlling a memory system which includes:

files managed by the system; data areas for storing therein the contents of said files; and management areas for storing therein a corresponding relationships between said files and said data areas, wherein when said file is erased, it is marked that said data areas corresponding to said management areas are empty area, and the contents of said management areas are detected, on the basis of signals inputted to said memory system, to erase said data areas.

According to an eleventh aspect of the present invention, there is provided a method for controlling a non-volatile semiconductor memory system, which comprises:

dividing a cell array into a plurality of physical blocks; storing each information corresponding to relationship between said physical block and logical block which is managed by said system, in each said physical block; and in order to form a table for managing corresponding relationships between said logical blocks and said physical blocks, in a random access memory in said system, sequentially preparing required corresponding relationships of corresponding relationships between said logical blocks and said physical blocks, in said random access memory in said system in accordance with accesses from a host.

According to a twelfth aspect of the present invention, there is provided a method for controlling a non-volatile semiconductor memory system which comprises:

dividing a cell array of non-volatile semiconductor memory cells into a plurality of physical blocks; storing each information corresponding to relationship between said physical block and logical block address in each said physical block, which logical blocks are managed by said system, in order to form an address translation table for managing corresponding relationships between said physical blocks and said logical block addresses, in a random access memory in said memory system, forming a plurality of areas, each area being formed by an aggregate of at least one of said plurality of physical blocks, controlling said system so that data in predetermined address of said logical block are stored in said predetermined area, forming an address translation table corresponding to said predetermined area in which data in said predetermined address of said logical block are stored, if necessary, when said non-volatile semiconductor memory is accessed.

According to a thirteenth aspect of the present invention, there is provided a method for controlling a non-volatile semiconductor memory system which comprises:

dividing a cell array of non-volatile memory cells into a plurality of physical blocks; storing each information corresponding to relationship between said physical block and logical block in a storage region of each of said physical blocks, which logical blocks are managed by said system; and forming a table for managing a corresponding relationship between said logical blocks and said physical blocks of a flash memory. In a random access memory of said memory system, said method further comprising:

ensuring an area formed by one or a plurality of physical blocks, on a cell array of said flash memory; in every memory access time, searching said object area of physical blocks, forming said table for managing said corresponding relationship between said logical blocks and said physical blocks, on said random access memory of said system, allowing to select physical blocks corresponding to said logical blocks by using said table.

According to a further aspect of the present invention, there is provided a method for controlling a non-volatile semiconductor memory system, which further comprises:

providing a function of selectively replacing defective physical blocks including defective cells with redundant physical blocks; and managing said functions, for said each area, so that the number of defective physical blocks is less than or equal to a predetermined number.

According to a fifteenth further aspect of the present invention, there is provided a method for controlling a non-volatile semiconductor memory system, which allows any one of various memory units to be detachably mounted in a body of said memory system, said method comprising selecting a corresponding one of various error correcting means of said body in accordance with said one of various memory units mounted in said body, to carry out error correction.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 2 is a table showing a physical block construction of a flash memory;

FIG. 3 is a table showing data in a personal computer;

FIG. 4 is a table showing a method for storing data in a flash memory;

FIG. 5 is a table showing a physical block construction of a flash memory;

FIG. 6 is a table showing a physical block construction of a flash memory;

FIG. 7 is a table showing a method for storing data in a flash memory;

FIG. 9 is a logical address/physical address translation table in a conventional memory system;

FIG. 10 is a logical address/physical address translation table in a 64-Mbit NAND-type flash memory system;

FIG. 11 is a table showing a data configuration of a block address of a flash memory;

FIG. 16 is a table showing a conventional relationship between a management area and a data area when am erase command is executed;

FIG. 30 is a table showing an ECC data construction in a memory system according to the present invention;

FIG. 31 is a view showing conditions for calculating an ECC code in a memory system according to the present invention;

FIG. 32 is a control flow chart of a memory system according to the present invention when a power supply is turned on;

FIG. 34 is a logical address/physical address translation table in a memory system according to the present invention;

FIGS. 42(a) and 42(b) are a table of an example of a logical block/physical block translation table in a preferred embodiment of the present invention;

FIG. 45 is a table showing a method for expressing physical block addresses in the preferred embodiment;

FIG. 46 is a table for explaining a conventional embodiment when a defective block is replaced with a redundant block;

FIG. 48 is a table for explaining a preferred embodiment when a defective block is replaced with a redundant block in view of a zone division control as a premise;

FIG. 49 is a schematic view of a PC card adapter according to the present invention;

FIG. 51 is a table showing parameters of another preferred embodiment of a DOS format of a flash memory according to the present invention; and FIG. 52 is a table showing a method for using an ECC code area.

DESCRIPTION OF THE PREFERRED EMBODIMENTS

Referring now to the accompanying drawings, the preferred embodiments of a memory system control method according to the present invention will be described below.

Figures 20, 21:
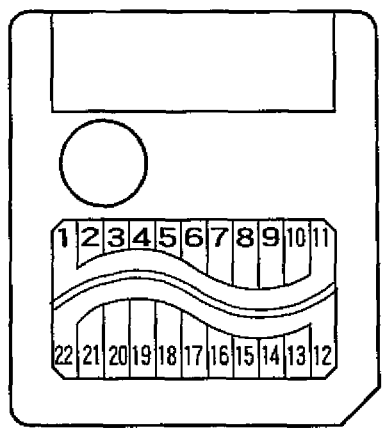
FIG. 20 is an outside drawing of a memory card for use in a memory system according to the present invention.
FIG. 21 is a table showing signal names of the respective terminals of the card of FIG. 20.

FIG. 20 shows a flash memory card for use in a memory system according to the present invention, and FIG. 21 shows signal names of the respective pins of a flat electrode of the memory card.

Figure 22:
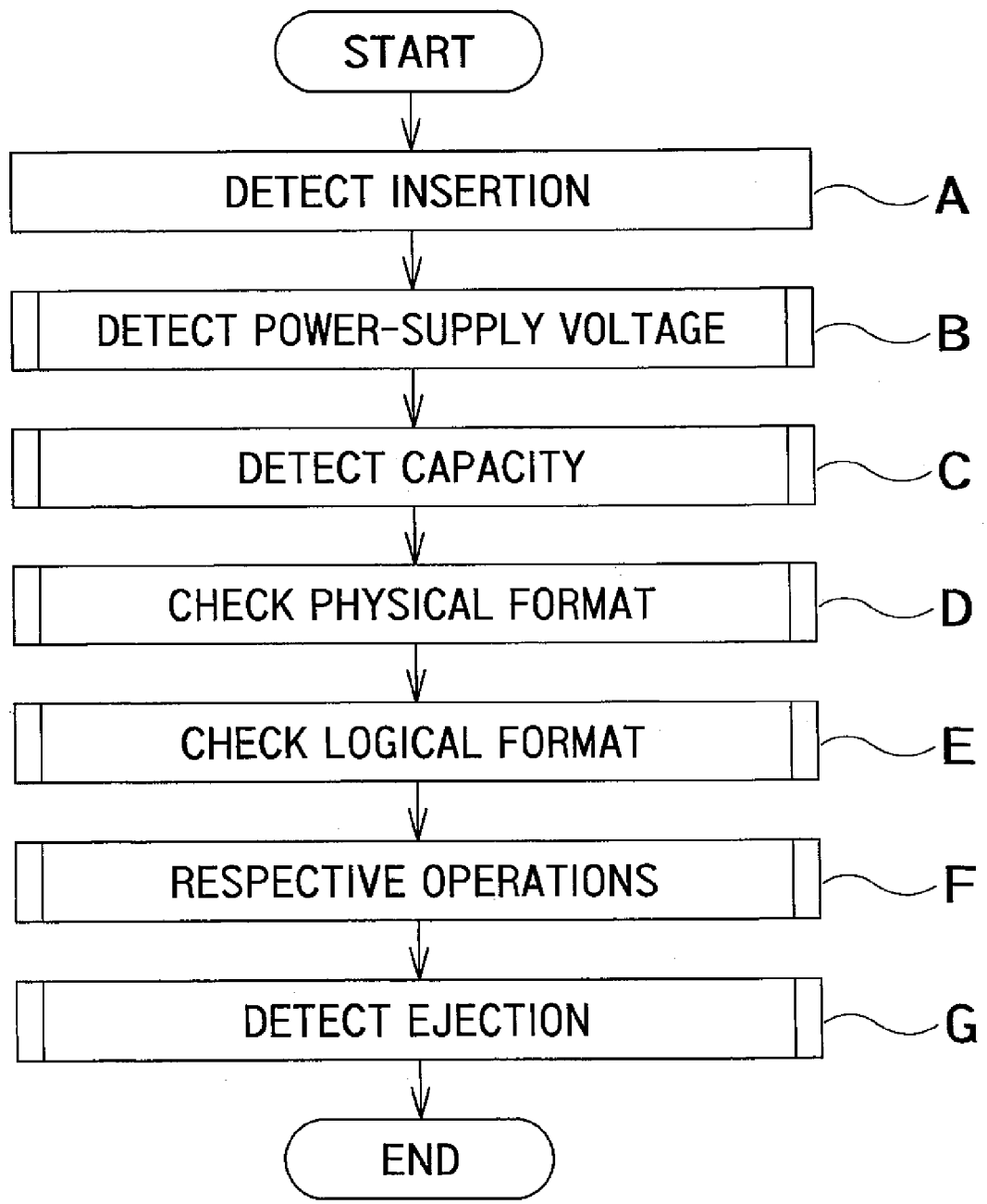
FIG. 22 is a main flow chart of a memory system using a method for controlling a memory system according to the present invention.

FIG. 22 shows a main control flow for use in the flash memory card. The operations of the respective steps in this flow will be described below.

First, an insertion detecting step A will be described below.

As described in the description of the prior art, the start of processing of a memory card assumes that the memory card is normally inserted into a connector. There is a possibility that physical or data destruction may be caused if the system accesses the memory card when the memory card is incompletely inserted. Therefore, in the control flow for the memory system according to the present invention, there is provided means for detecting whether a memory card is normally inserted. This means may be structural or electrical.

For example, a detecting switch may be provided in the connector at a position (e.g., the innermost part of the connector) so that the detecting switch can transmit a detection signal to the system after the memory card is held at a normal contact position.

Alternatively, there may be provided a system mechanism for ensuring that the memory card is held at a normal position, not for detecting insertion. For example, a lid may be provided in an inlet for the memory card so that the lid pushes the memory card to a home position when the lid is closed.

In addition, means for electrically detecting the insertion of the memory cart may be provided.

A power supply voltage detecting step B will be described in detail below.

The memory cards include a product having a power supply voltage of 5 V and a product having a power supply voltage of 3.3 V. If a voltage of 5 V is applied to a memory card operated by a power supply voltage of 3.3 V, there is a possibility that voltage destruction and so forth may be caused. In order to avoid this, the system is designed to detect a power supply voltage for a memory card. Methods for detecting the power supply voltage may include a method for determining the power supply voltage based on the appearance of the memory card, and a method for electrically determining the power supply voltage.

Figure 23A:
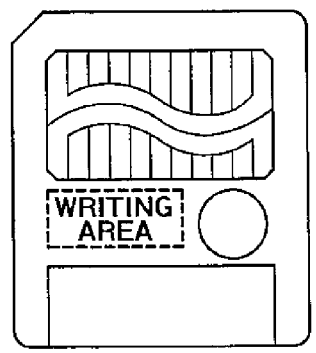
FIGS. 23(a) and 23(b) are a schematic view showing the relationship between a power supply voltage and an appearance of a memory card.
Figure 23B:
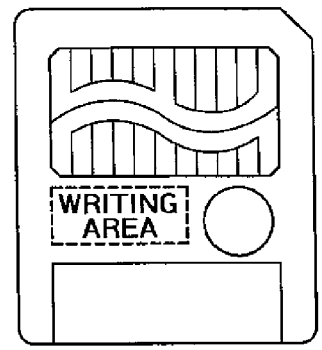

FIGS. 23(a) and 23(b) show an example of a method for determining a power supply voltage for a memory card based on the appearance of the memory card. The 5 V product has a cutout on the left side of the upper end thereof as shown in FIG. 23(a), and the 3.3 V product has a cutout on the right side of the upper end thereof as shown in FIG. 23(b). Thus, it is possible to easily visually determine the power supply voltage for the memory card.

Figure 24A:
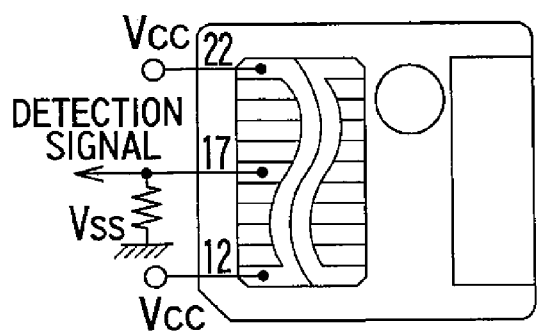
FIGS. 24(a) and 24(b) are a schematic view showing a method for electrically detecting a power supply voltage of a memory card.
Figure 24B:
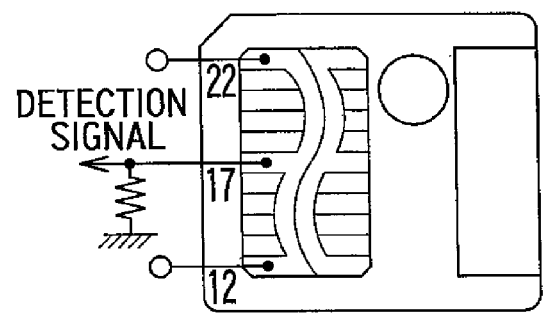

FIGS. 24(a) and 24(b) show an example of a method for electrically detecting a power supply voltage for a memory card. In this case, a number 17 pin is used for detecting the power supply voltage. For example, in the 5 V product, the number 17 pin is electrically on the floating condition as shown in FIG. 24(a), and in the 3.3 V product, the number 17 pin is short-circuited to a VCC line on the surface of the memory card.

On the system side, the number 17 pin is pulled down to a VSS via a resistor. On the system side, a voltage of 3.3 V is supplied to a number 12 pin and a number 22 pin as a VCC. At this stage, a voltage of 5 V is not applied to a power supply voltage terminal. The system monitors the level of the number 17 pin. When the level of the number 17 pin is a "L" level, the system determines that the memory card is the 5 V product, and when the level of the number 17 pin is a "H" level, the system determines that the memory card is the 3.3 V product. In accordance with the determined results, a normal power supply voltage is applied to the power supply voltage terminal.

Figure 25:
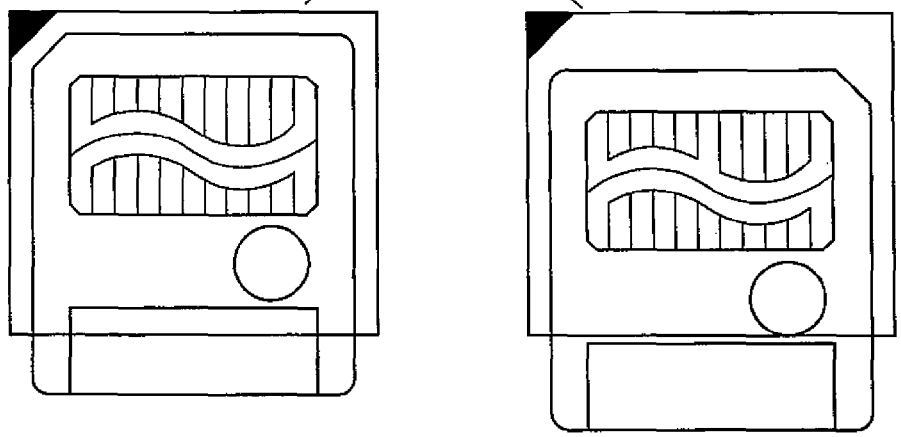
FIG. 25 is an outside drawing of a 5 V dedicated connector.

The electrical detection may be omitted by the improvement of a connector. FIG. 25 shows an example of a dedicated system for the 5 V product. The 5 V dedicated system may use a connector with a cutout detecting mechanism so as to prevent the 3.3 V product from being inserted. In this case, it is also possible to prevent the memory card serving as the 5 V product from being inserted upside down. Although the 3.3 V product can be inserted upside down, it is possible to prevent the 3.3 V product from electrically contacting the system. Although FIG. 25 is simplified in order to facilitate better understanding thereof, the following consideration is given. In the case of a system wherein a supply voltage of 5 V is always supplied to a connector, a misinsertion preventing mechanism utilizing the cutout must function before the terminals of the memory card contact the terminals of the connector. For example, the misinsertion preventing mechanism may be positioned in the vicinity of the inlet of the connector so as to prevent the memory card from electrically contacting the system when misinsertion is carried out.

Figure 26:
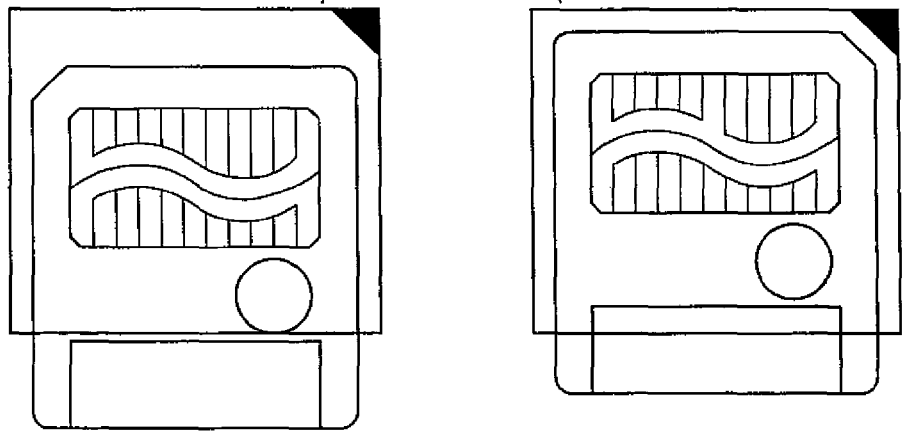
FIG. 26 is an outside drawing of a 3.3 V dedicated connector.

FIG. 26 shows an example of a 3.3 V dedicated system. The 3.3 V dedicated system uses a connector with a cutout detecting mechanism so as to prevent the 5 V product from being inserted. In this case, it is also possible to prevent the 3.3 V product from being inserted upside down. Although the 5 V product can be inserted upside down, it is possible to prevent the 5 V product from electrically contacting the system.

Figure 27:
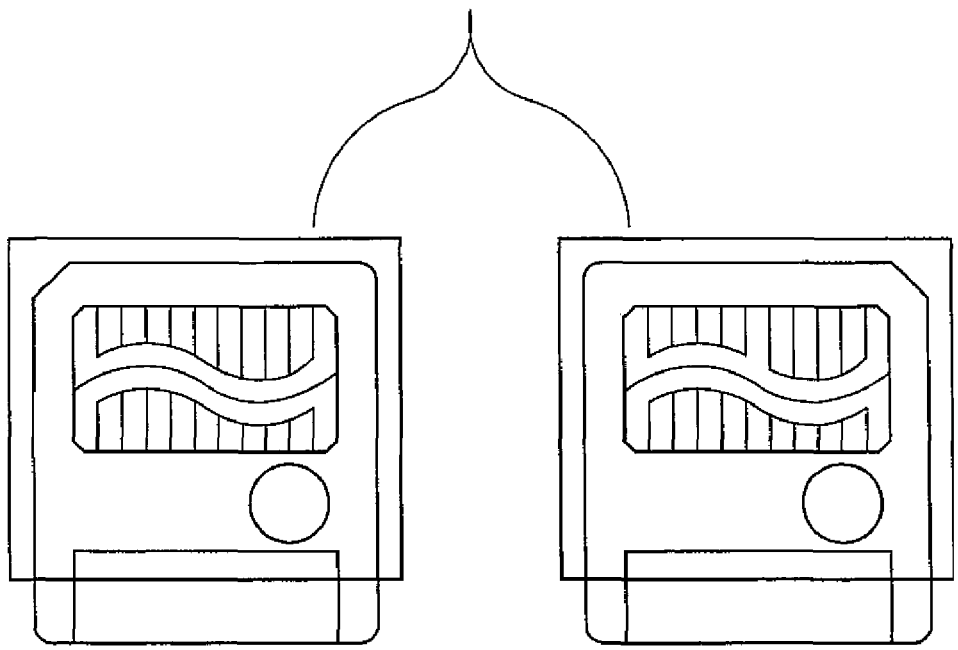
FIG. 27 is an outside drawing of a 5 V/3.3 V dedicated connector.

FIG. 27 shows an example of a 5 V/3.3 V dual purpose system. In the case of the dual purpose system, either of the 5 V and 3.3 V products may be inserted into the system. Therefore, this system is designed to prevent a power supply of 5 V from being applied to the 3.3 V product. That is, a power supply voltage of 5 V may not be outputted when a 3.3 V memory card is inserted. The supply voltage of 5 V is not applied to the device until the power supply voltage is electrically detected to verify that the inserted memory card is the 5 V product.

A capacity detecting step C will be described below.

There are various flash memories having different memory capacities and interface specifications. When a memory card is inserted into the system, a maker code, device code or the like of the device is determined to inhibit new access when an unsupported code is determined. In order to read the maker code, device code or the like, a normal power supply voltage is inputted.

A physical format checking step D will be described below.

The memory card has a physical format for storing data. When a memory card is inserted into the system, the physical format thereof is checked. If the memory card has an unsupported format, it is rejected without altering data. If the system executes a physical format again when an unknown physical format product is inserted, there is a risk that the processing for innate and acquired defective blocks of the flash memory may be incomplete, so care should be taken. For example, a 16-Mbit NAND-type flash memory is divided into 512 physical blocks. In the top block thereof, a physical format, an attribute information of the card and so forth are written. Since the remaining blocks are used as data areas, it may be determined whether a supportable physical format is provided by examining data of the top block.

A logical format step E is carried out to allow the memory card to be accessed as a device on the DOS. It is also required to check whether the logical format of the memory card is supported. If the cluster delimiter of the DOS is coincident with the delimiter of the physical block of the NAND flash memory, it is possible to carry out a higher speed operation.

At step F, the respective operations indicate the memory access operations of the system, and include read-out, write and erase operations.

At an ejection detecting step G, ejection is detected in a manner similar to the above described insertion detection. When ejection is detected, the operation of the memory system ends.

For the above described control flow for the memory card, methods for electrically detecting the insertion/ejection of a memory card are disclosed in Japanese Patent Laid-Open Nos. 8-90969 and 8-202509. A method for controlling a memory system using connector terminals sequentially connected to the terminals of a memory card (a storage medium) will be described below.

Figure 28:
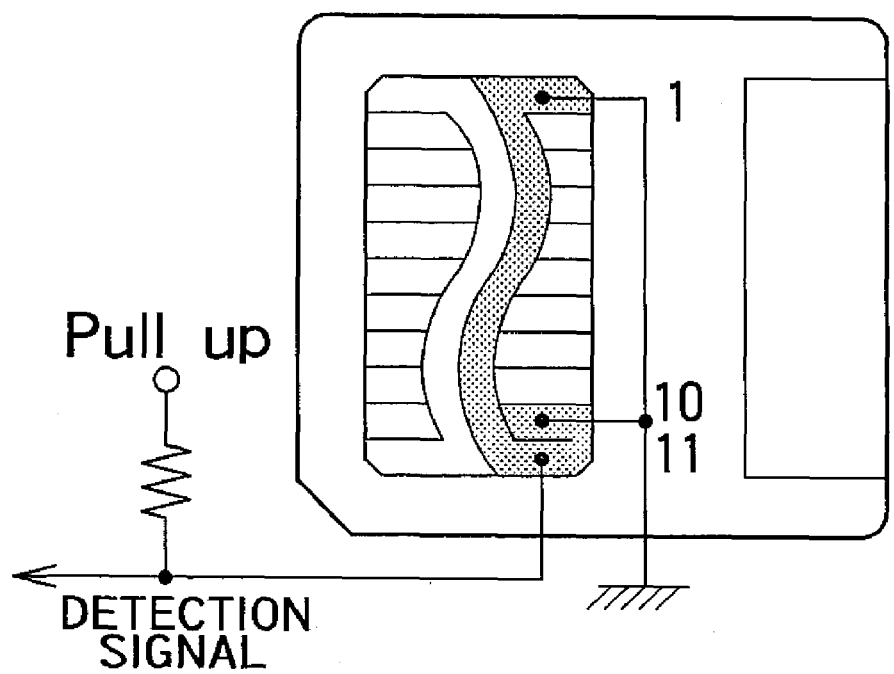
FIG. 28 is a schematic view showing a method for detecting the insertion/ejection of a memory card.

Referring to FIG. 28, a method for detecting the insertion/ejection of a memory card in the memory system using the connector will be described below.

A number 1 pin terminal and number 10 pin terminal of the connector are connected to a VSS, and a number 11 pin terminal of the connector is pulled up to a VOC level. When the number 11 pin terminal of the memory card does not contact a connector terminal, the potential level of the connector terminal is held at a "H" level by means of a pull-up resistor. When the number 11 pin of the memory card contacts the connector terminal, the number 11 pin is connected to VSS via the number 1 pin and number 10 pin, so that the potential level is changed to a "L" level. Therefore, it is possible to electrically detect the insertion of the memory card on the basis of the transition of the potential of the connector terminal of the number 11 pin to the "L" level, and the ejection thereof on the basis of the transition from the "L" level to the "H" level. In order to electrically detect the insertion by means of the number 11 pin, it is required to allow terminals other than the number 11 pin to contact the terminals of the connector if the number 11 pin contacts the connector terminal. The value of the pull-up resistor may be adjusted so as to meet the required specifications of the system.

In the above described memory system using the connector, a control method during the insertion/ejection of the memory card will be described in detail below. In this preferred embodiment, as a practical example, a hot-line insertion/ejection will be described. The term "hot-line insertion/ejection" means the insertion/ejection of a memory card while a power supply voltage is applied to a connector. In order to prevent malfunction and electrical destruction of the memory, the following care should be taken.

If control signals (/CE, /WE, CLE, etc.) and an I/O pin are undefined while a power supply voltage is supplied, there is a possibility that an unintended write or erase command or the like may be received. In addition, if /CE="L" and /RE="L" while a power supply voltage is supplied, the device condition is a data output condition. At this time, if the system side condition is also a data output condition, there is a possibility that collision occurs on a data bus, having an undesired influence on the device. Generally, in a CMOS device, if a potential higher than the power supply voltage is applied to an I/O pin, there is a possibility that current flows into the device to cause the latch up and so forth. An example of a method for avoiding the above described matters is described below. For example, the contact and removal sequences for connector terminals are provided, and the contact and removal are sequentially carried out, so that it is possible to achieve the hot-line insertion/ejection. For example, the undermentioned four-stage sequence is suitable for use in a PC card adapter or the like since there is a little limit to the system side. The contact sequence for the connector and the limitations on the system side are as follows.

TABLE 1

| Connector Contact Sequence | | System Side |
|---|---|---|
| Contact Sequence | Contact Pin | Setting Condition |
| First Stage | VSS(1, 10), CLE, ALE, /WP | When Not Accessing Memory, Each Control Signal (/CE, /WE, /RE, CLE, ALE, etc.) Should Be Held On Inactive Stage |
| Second Stage | VCC, /CE, /RE, /WE | |
| Third Stage | Pin at First, Second, Third Stages or More | |
| Fourth Stage | 11 Pin | |

In this case, at the first stage, the contact with a VCC terminal is made to establish the ground level of the chip, and the level of a CLE terminal is fixed to a "L" level (an inactive state) so as to avoid the problem that an erroneous command is input with noise and so forth in a subsequent sequence that erroneously erases the device. At the second stage, the /CE terminal is fixed to the "H" level (an inactive state) so that the state of the output pin of the device is a high impedance state, thereby preventing the collision of data on the bus regardless of the bus control state on the system side. At the third stage, the problem that current flows into the output pin from the bus line is avoided since the VCC reaches a predetermined level at the second stage. At the fourth stage, the number 11 pin finally contacts the connector terminal. As described above, the number 11 pin serves as an insertion/ejection detecting terminal.

In addition to the hot-line insertion/ejection in the four-stage sequence, a hot-line insertion/ejection in a two-stage sequence may be used. In this case, the contact sequence for the connector and the limitations on the system side are as follows.

TABLE 2

| Connector Contact Sequence | | System Side |
|---|---|---|
| Contact Sequence | Contact Pin | Setting Condition |
| First Stage | VSS(1, 10), CLE, ALE, /WP | When Not Accessing Memory, Each Control Signal (/CE, WE, RE, CLE, ALE, etc.) Should Be Held On Inactive Stage I/O Pin Should Be Held in Hi-z State |
| Second Stage | Pin other than Pin Contacting At First Stage | |

In this case, at the first stage, the contact with the VCC terminal is made to establish the ground level of a chip, and the level of the CLE terminal is fixed to the "L" level (the inactive state) so as to avoid the problem that an erroneous command is input with noise and so forth in a subsequent sequence to erroneously erase the device. At the second stage, the VCC, /CE, I/O pins and so forth do not completely simultaneously contact the connector terminals, and any one of unintended contacts may occur at the contact timing. However, if the I/O bus is held in the high impedance state on the system side, it is possible to avoid the collision of data and the flow of current into the pin on the bus.

Figure 29:
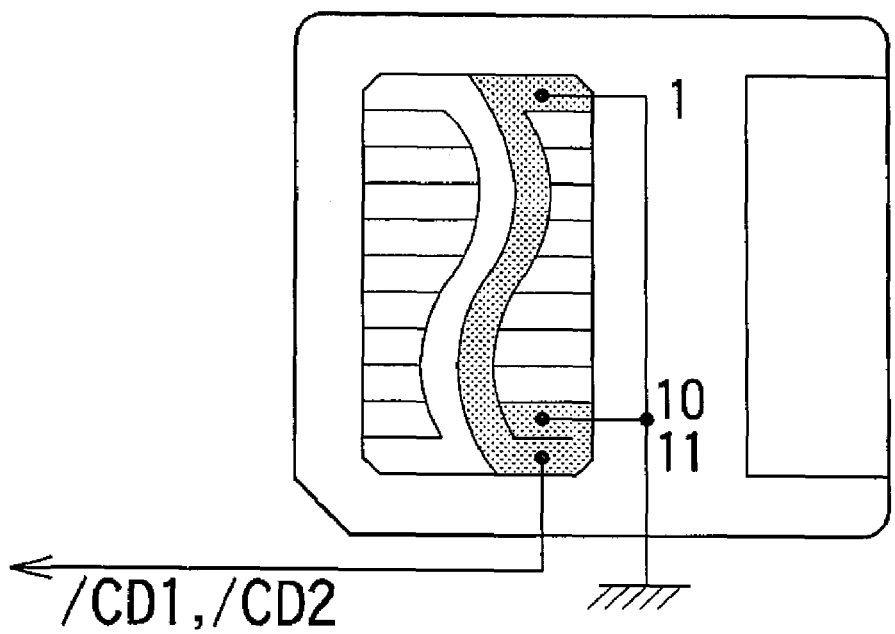
FIG. 29 is a schematic view showing a method for detecting the insertion/ejection of a memory card when the memory card corresponds to a PC card adapter.

The connector for the four-stage contact sequence may also be applied to a PC card type adapter. A typical PC card has two pins, -CD 1 and -CD2 pins, which are defined as card detecting pins, and the insertion/ejection of the PC card is typically detected on the system side while both pins are pulled up. As a signal generating method for the -CD 1 and -CD2 pins in the PC card adapter, an example of a method using the 11 pin of the memory card is shown in FIG. 29. In this case, a standard sequence for a personal computer will be described below. When only a PC card adapter is inserted into a personal computer, the personal computer determines that no card is inserted. When a memory card is inserted into the personal computer, the VSS (1, 10 pins) first contacts a four-stage contact sequence connector. At this stage, GND level is supplied from the personal computer. After sequential connection proceeds and all the pins are connected, the 11 pin is finally connected. At this stage, the levels of the -CD 1 and -CD2 are reduced to the "L" level, and the personal computer side recognizes that the card is inserted, so that the initializing processing is started and a power supply is turned on on the personal computer side.

The processing performed when a memory card is ejected while accessing the memory card will be described. Since this action should be basically an inhibit action, it is naturally conceived that means, such as an access lamp, for informing the user that the personal computer is accessing the memory card is provided. However, if the memory card is erroneously ejected during erase or write operation, there is a possibility that data other than those of an accessed block may be corrupted. For that reason, the following sequence is carried out to reduce the possibility that data other than those of a selected block may be corrupted. An example of a connector of a four-stage insertion/ejection sequence will be described below.

When a memory card is ejected, the memory card is removed in the reverse sequence to the above described contact sequence. First, the ejection of the memory card is detected by means of the 11 pin. Then, a write enable signal /WP is enabled to reset the erase or write operation. The time required for reset is 1.5 seconds or less at the maximum in an erase mode. In order to normally carry out the reset operation, the power supply voltage must be supplied to the memory card, and the logic in the memory card must be normally operated. When the four-stage removal sequence is used, it is ideal that the reset operation is completed before the VCC pin is removed and that the reset operation is completed before the I/O pin and so forth are removed at the third stage.

In addition, the second-stage removal sequence can be achieved by removing the pins in the reverse sequence to the above described two-stage insertion sequence.

Moreover, a three-stage contact/removal sequence for simultaneously carrying out the third and fourth stages of the four-stage contact/removal sequence is effective in data protection during the hot-line insertion/ejection.

As described above, according to the memory system control method of the present invention, it is possible to improve the stability of operation during the insertion/ejection of the memory card when the insertion/ejection of the memory card is detected, and it is possible to protect data during the hot-line insertion/ejection.

The second preferred embodiment of the present invention will be described in detail below.

In this preferred embodiment, there is provided a flash memory card, which has a reduced capacity of a RAM area necessary for a logical address/physical address translation table.

First, the structure of a physical block and the relationship with a logical block in a memory system according to the present invention will be described below.

The structure of a physical block and the data construction in the physical block in a memory system according to the present invention are the same as those described in the description of the prior art, and shown in FIGS. 2 and 4. Referring to FIG. 4, the meanings of the respective bytes in a physical block in a memory system according to the present invention will be described.

Data Area-1 stores the data of the first half 0 to 255 bytes of the data of 512. Data Area-2 stores the data of the second half 256 to 511 bytes of the data of 512 bytes. The data of a User Data Area are open to a user, and the use thereof is entrusted to the user. A Data Status Area indicates whether data are normal. Although an "FFh" is usually set, a "00h" is set when abnormal data are written. A Block Status Area indicates whether a block is good or defective.

Although the "FFh" is usually set, the "00h" (an initial defective block) or an "F0h" (an acquired defective block) is set in the case of a defective block. When a block has "0"s of two bits or more, it is determined that the block is a defective block. Furthermore, the same value for all the data is written in the same block. A Block Address Area-1 indicates a logical address information of a block. Furthermore, since 8 sectors forming one logical block correspond to one of 512 physical blocks, the same value for all the data is written in the same block. Similarly, in a Block Address-2, the same contents as the data of the Block Address Area-1 are written. An ECC Area-1 is a 3-byte ECC code of even page data (256 bytes). An ECC Area-2 is a 3-byte ECC code of odd page data (256 bytes).

Figures 30, 31:
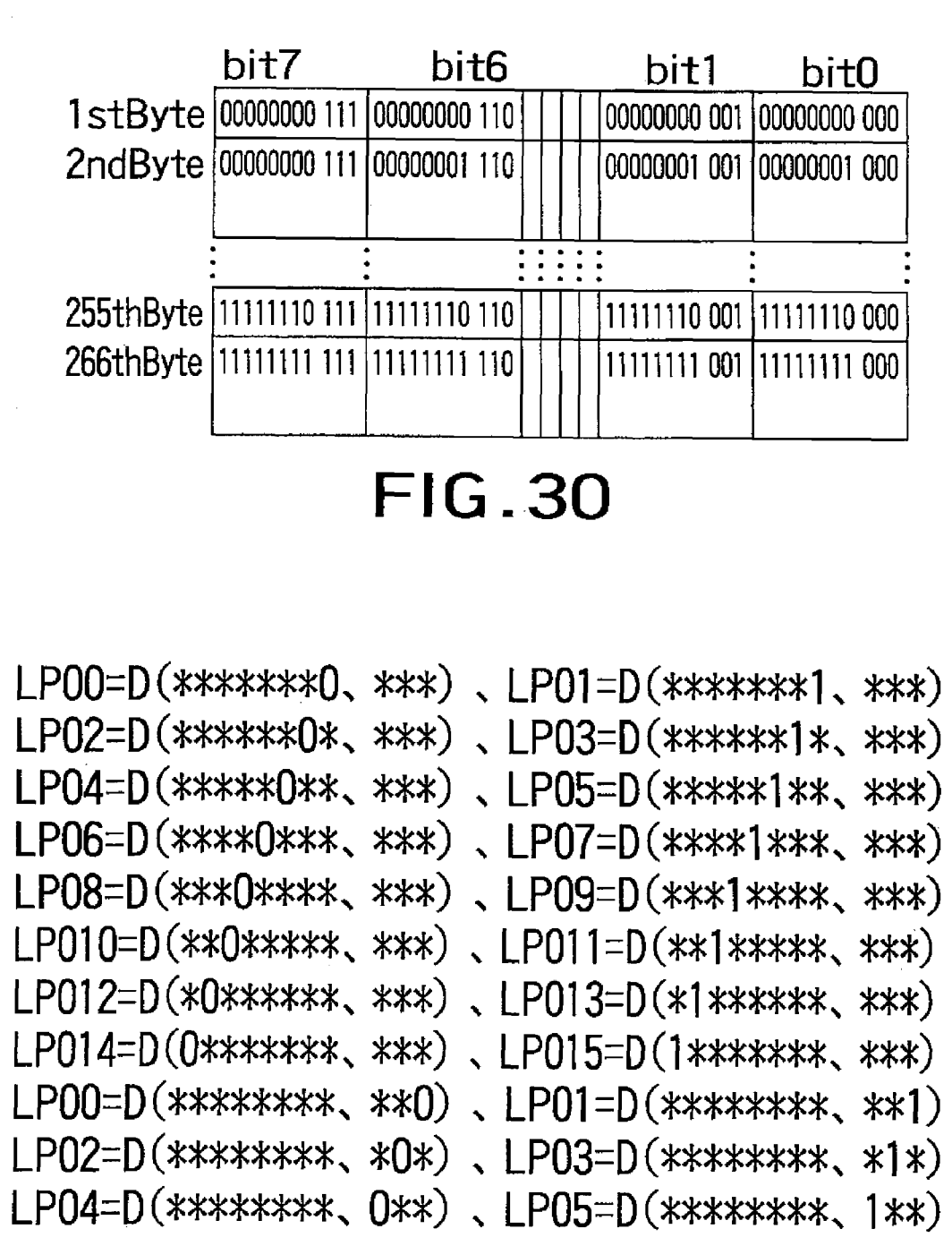

The ECC will be described below. In this preferred embodiment, an ECC code is generated for every data page of 256 bytes (2048 bits). ECC data of 22 bits are used for 256 bytes so as to have a correction function of 1 bit. FIG. 30 shows the arrangement of 256 bytes of data.

That is, bit 0 of the input at the first byte is the first bit (address: 00000000 000) of 2048 bits, and bit 7 of the input at the 255th byte is the 2048th bit (address: 11111111 111) of 2048 bits.

The ECC code (line parity (LP) and column parity (CP)) is calculated as an odd parity of 1024 bits meeting the conditions shown in FIG. 31.

Column parities CP0 through CP5 are updated each time data of 1 byte (8 bits) are inputted. When the ECC code is generated by software, there may be provided a method, which previously has the calculated results of column parities for an input of 1 byte (256 ways) on an ROM in the system. By this method, it is not required to carry out calculation every bit, so that it is possible to considerably reduce the time required for calculation. Alternatively, there may be provided a method for deriving the calculated results of column parities for an input of 1 byte (256 ways) at one time when a power supply is turned on, to hold the calculated results on a RAM. In comparison with the former method, it is required to provide the RAM area although it is not required to provide a ROM.

Figure 32:
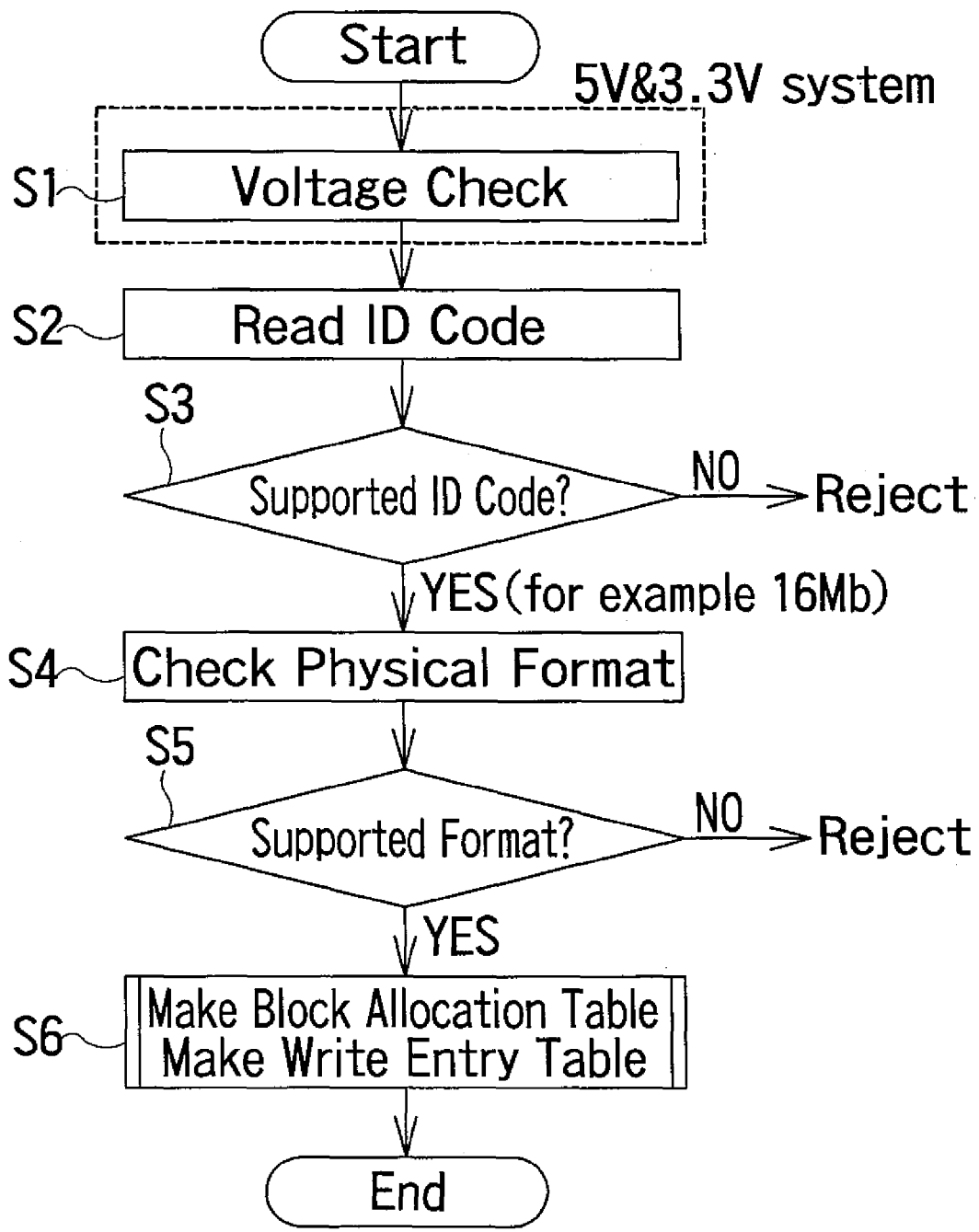

FIG. 32 is a control flow chart for the second preferred embodiment of a flash memory card according to the present invention when a power supply is turned on. This control flow will be described below.

(Step S1) A power supply voltage is detected in response to the insertion of the memory card into the connector.

(Step S2) An ID code of the memory card is read out, and the storage capacity is read.

(Step S3) If an ID code that is not supported by the system is read out, it is rejected.

(Step S4) The physical format is checked. The information on the top block of the physical address is read.

(Step S5) If a physical format that is not supported by the system is designated, it is rejected.

(Step S6) A logical address/physical address translation table is prepared, and an erased area for write in the next write operation is selected.

Figure 33:
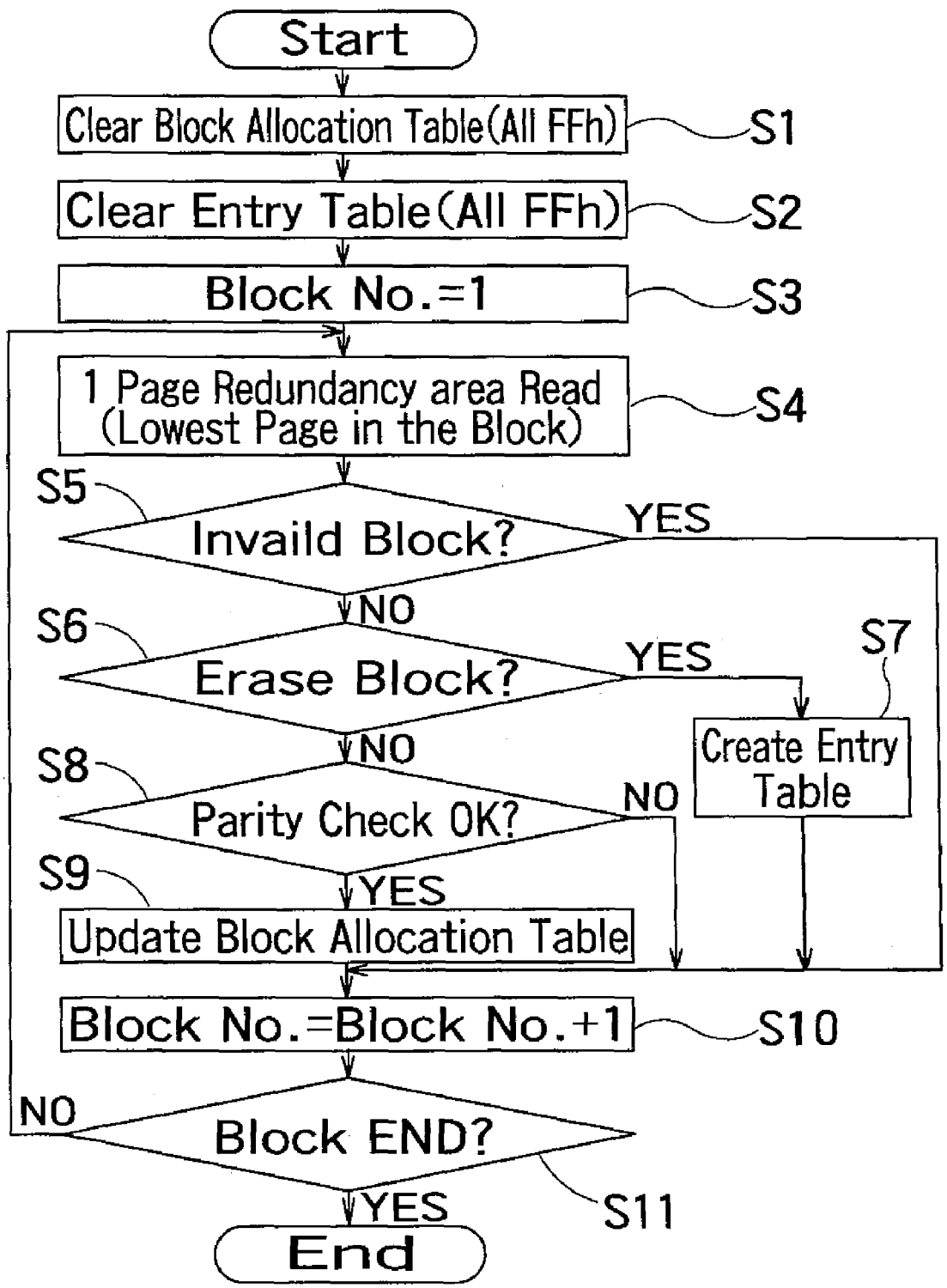
FIG. 33 is a flow chart for preparing a logical address/physical address translation table in a memory system according to the present invention.

FIG. 33 shows a flow chart for preparing a logical address/physical address translation table, which is shown at the aforementioned step S6 and which is prepared when a power supply is turned on.

(Step S1) A RAM area for storing therein a logical address/physical address translation table is reset.

(Step S2) A table area for storing therein an erased block used for the next data writing is reset.

(Step S3) Search is started from physical block 1.

(Step S4) A redundant division of the block is read out.

(Step S5) On the basis of data in a predetermined area, it is determined whether the block is a normal block. When the block is a defective block, the subsequent processing is not required, and the search for the next block is carried out.

(Step S6) It is determined whether the area is an erased area.

(Step S7) If it is an erased block, it is stored in the table as a proposed block used when the next write is carried out.

(Step S8) If it is not the erased area, a logical address information area is extracted. At this time, a parity check is carried out to check validity.

(Step S9) On the basis of the above contents, a logical address/physical address translation table is prepared.

(Step S10) Physical block number is counted up.

(Step S11) After 512 blocks are searched, the routine ends.

FIG. 34 shows a logical address/physical address translation table prepared according to the aforementioned flow. The term "physical block area" shown in FIG. 34 means an aggregate of two continuous physical blocks. For example, physical block area 0 indicates physical block 0 and physical block 1. In this table, one physical block area is allocated to one logical block. For example, when physical block area 5 is allocated to logical block 0, actual data of logical block 0 are stored in physical block 10 or 11. Therefore, when access is actually carried out, it is required to search for a data area indicating the relationship with the logical addresses of the redundant divisions of the physical blocks 10 and 11 to determine which actually stores data of the logical block 0. However, since it is enough to read only a very limited area, there is little influence on the performance of memory access.

At this time, 256 (512/2) physical block areas exist as a whole and can be described by 8-bit address data. If the table is formed so that an address offset directly indicates a physical block for convenience of the software, it is required to provide 1 byte for one block, i.e., a RAM area of 0.5 KB in total. For example, the address of a physical block area storing therein the information on physical block 5 is stored in the fifth byte offset from the top of the table.

The 0.5 KB RAM capacity is a half of 1 KB RAM capacity conventionally required. Usually, a general purpose CPU has a RAM area of about 1 KB. According to this preferred embodiment, it is possible to reduce the RAM area by 0.5 KB to obtain a great advantage.

That is, it is possible to form the system by using an empty area of 0.5 KB without the need of an external RAM increasing costs, so that it is possible to reduce costs.

The present invention should not be limited to the above described preferred embodiment, but four physical blocks may be defined as a physical block area, or a larger number of blocks may be supposed.

Figure 35:
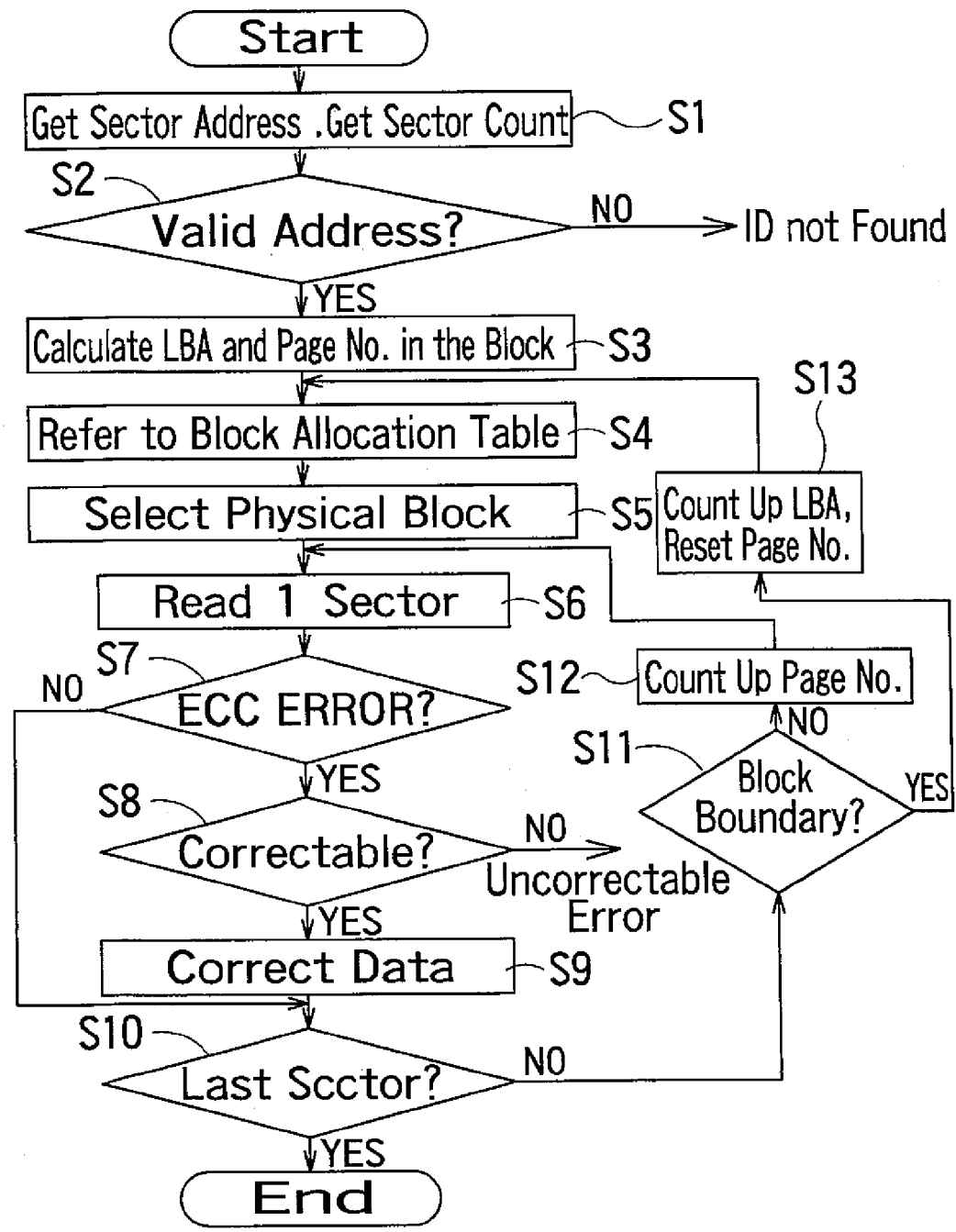
FIG. 35 is a flow chart of a memory system according to the present invention when read-out is carried out.

FIG. 35 is an operation flow chart of a memory card in this preferred embodiment when read-out is carried out. This flow will be described below.

(Step S1) The top sector address for carrying out read-out and the number of transfer sectors are received from the host.

(Step S2) It is verified whether the read-out range is a valid range.

(Step S3) The sector is converted to a logical block. Since one block comprises 8 sectors in the case of a 16-Mbit product, one block is divided by 8.

(Step S4) A physical block area, in which the corresponding logical block exists, is obtained by referring to a logical address/physical address translation table.

(Step S5) The logical address information areas of the physical blocks in the block area are examined, and it is determined which physical block stores therein data of the designated logical block.

(Step S6) The data of one sector is read out of the identified physical block. For example, when the sector number is 0, the data of the top 2 pages of the physical block are read, and when the sector number is 7, the data of the end 2 pages of the physical block are read. In one physical block, the data of 8 sectors are arranged in sequence.

(Step S7) Error check for the read-out data is carried out, and the presence of an error is checked.

(Step S8) When an error is detected, it is determined whether the data can be corrected.

(Step S9) When an error is detected and when the data can be corrected, the data is corrected.

(Step S10) After the number of sectors required by the host are read out, the routine ends.

(Step S11) It is determined whether the next read sector exceeds the boundary between physical blocks. For example, when the sector is transferred from sector 7 to sector 8, data exist in different physical blocks, so that the system refers to the logical address/physical address translation table again.

(Step S12) When the read-out is continued in the same block, pages to be read out are counted up.

(Step S13) When the block to be read is moved to another block, the logical block is counted up, and the count of pages is also reset.

The write operation in this preferred embodiment will be described below.

Basically, the write operation is roughly divided into the following three processes. The case where, e.g., logical sector 3, is rewritten will be described. Although only sector 3 is updated, the processing for one block is required since data of 8 sectors, sectors 0 to 7, exist in the same block.

First, since the data of logical sectors 0, 1 and 2 are not updated, the data of logical sectors 0, 1 and 2 are copied on a physical block to be newly written from the originally stored physical block.

Secondly, since logical sector 3 is updated, it is not required to copy the original data, and the data supplied from the host are written in a block to be newly written.

Thirdly, since the data of logical sectors 4 through 7 are not updated, the data of logical sectors 4 through 7 are copied on a physical block to be newly written from the originally stored physical block.

As described above, the operations of copy/updated data writing/copy for one block are basically carried out. When a write in sectors 0 through 7 is carried out, all the data of one block are updated, so that the copying operation is clearly unnecessary. The branch of the undermentioned flow chart proceeds mainly while determining whether a sector to be written is a data update or copying operation.

Figure 36:
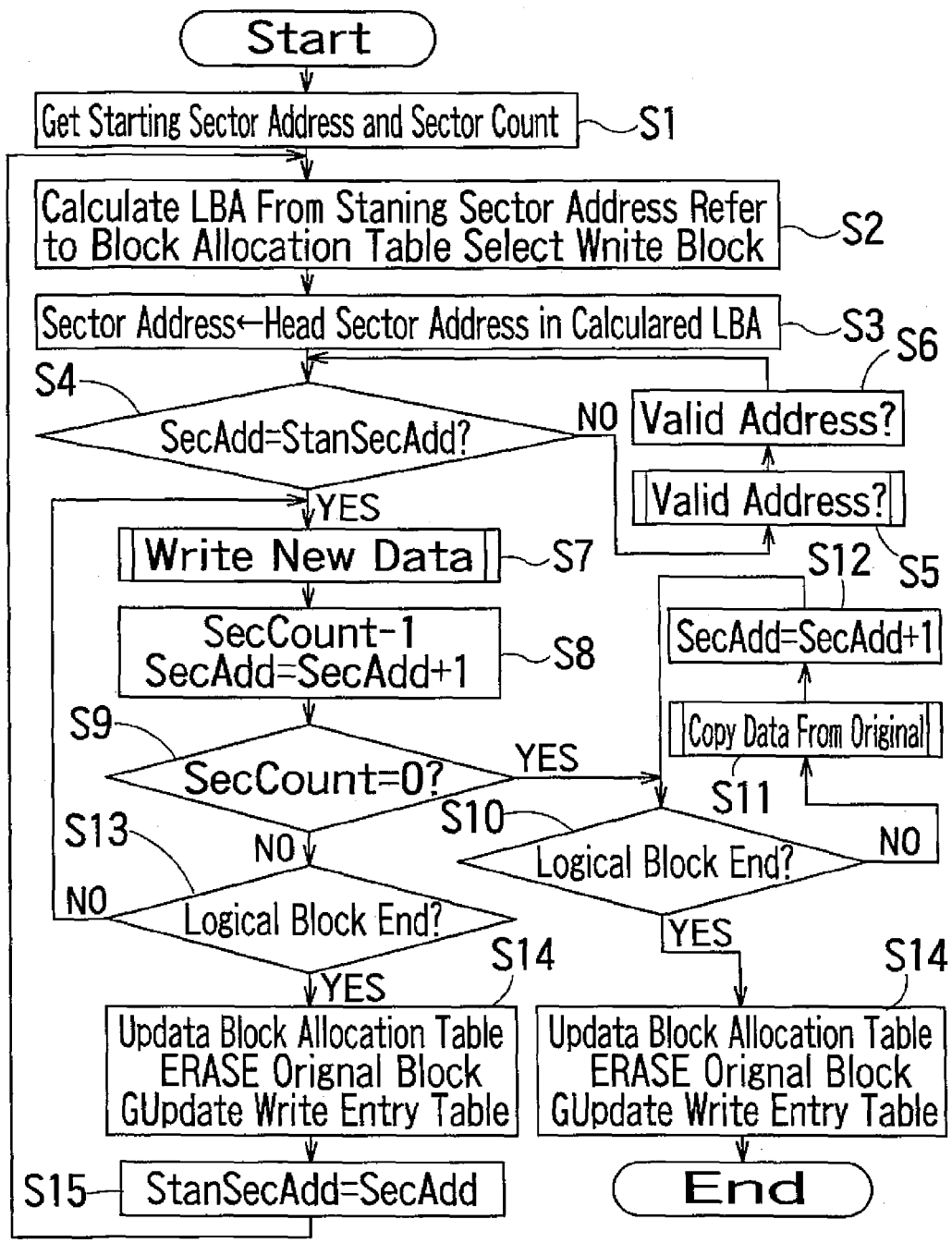
FIG. 36 is a flow chart of a memory system according to the present invention writing is carried out.

FIG. 36 is an operation flow chart of a flash memory card in this preferred embodiment when write is carried out. This flow will be described below.

(Step S1) The top sector address for carrying out read-out and the number of transfer sectors are received from the host.

(Step S2) This information is converted to a logical block number to refer to the logical address/physical address translation table. An actual physical block is selected from two blocks of a logical block area similar to the read-out operation. Data to be copied are read out from the selected block.

(Step S3) The processing is started from the top of the physical block.

(Step S4) It is determined whether the copying operation in the first half of the block or the update of data is carried out.

(Step S5) When the copying operation is carried out, data are read out of the original block, and write is carried out in a new block.

(Step S6) The processing for the next sector is carried out.

(Step S7) When it is determined at step S4 that an update of data is carried out the write is carried out on the basis of the updated data received from the host.

(Step S8) The processing for the next sector is carried out.

(Step S9) It is checked whether write has been carried out for the number of sectors required by the host.

(Step S10) If it is determined at step S9 that write has been carried out for the required number of sectors, it is determined whether the process has reached the boundary between blocks. If unwritten areas remain, the copying operation on the second half of the block is carried out. If the process has reached the boundary between blocks, it is not required to carry out the copying operation.

(Step S11) Data are read from the original block to be written in a new block.

(Step S12) The processing for the next sector is carried out.

(Step S13) When it is determined at step S9 that the number of sectors required to be written by the host is not completed, it is required to carry out more writing. However, when the process reaches the boundary between blocks, the processing for the next physical block is carried out.

(Step S14) Before the processing for the next block is carried out or before the processing is completed, the logical address/physical address translation table is updated on the basis of the written results, and the physical block, in which the original data exist, is erased. In addition, a proposed area is registered as a new write area for the next processing.

(Step S15) The processing for the next block is carried out.

As described above, according to the memory system control method in this preferred embodiment, it is possible to considerably reduce the RAM area. In the conventional memory card system, the RAM capacity required for the logical address/physical address translation table is large, and the system cannot be constructed only by the integrated RAM of the general purpose CPU, so that the external RAM must be provided. On the other hand, the memory card system of the present invention uses a flash memory control method, which can reduce the RAM capacity required for the logical address/ physical address translation table and which can control only the integrated RAM of the general purpose CPU. Thus, the external RAM, which has been conventionally required, is not required, so that it is possible to considerably reduce costs.

The third preferred embodiment of the present invention will be described in detail below.

In this preferred embodiment, there is provided a flash memory card, which can carry out the write operation of data at a higher speed when it is used in the DOS format.

Figure 37:
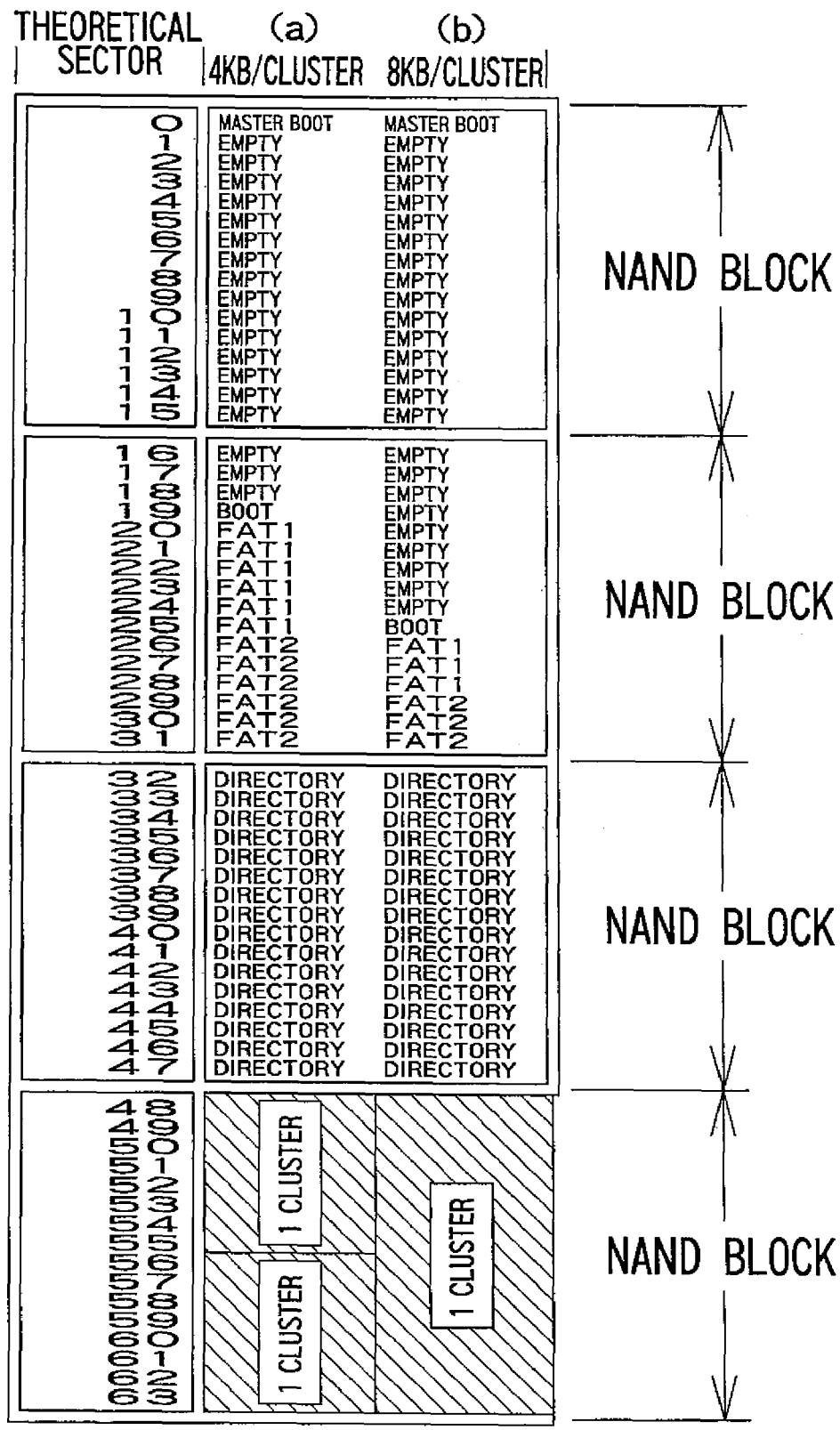
FIG. 37 is a view showing parameters of a DOS format according to the present invention.

Parts (a) and (b) of FIG. 37 show DOS format parameters in this preferred embodiment, wherein part (a) shows the case of a cluster size of 4 KB, and part (b) shows the case of a cluster size of 8 KB. When the cluster size is 4 KB, a master boot sector is arranged in logical master 0, and a boot sector is arranged in logical sector 19. In addition, FATs are arranged in logical sectors 20 through 25, and the copies of the FATs are arranged in logical sectors 26 through 31. Moreover, directories are arranged in logical sectors 32 through 47, and file data areas are arranged in and after logical sector 48. When the cluster size is 8 KB, a master boot sector is arranged in logical sector 0, and a boot sector is arranged in logical sector 25. In addition, FATs are arranged in logical sectors 26 through 28, and the copies of the FATs are arranged in logical sectors 29 through 31. Moreover, directories are arranged in logical sectors 32 through 47, and file data areas are arranged in and after logical sector 49. Thus, in either case of cluster sizes of 4 KB and 8 KB, parameters are set so that the cluster delimiter does not straddle the boundary of physical block. This is achieved by adjusting a place, in which a boot sector is arranged, of the DOS format parameters.

Figure 38:
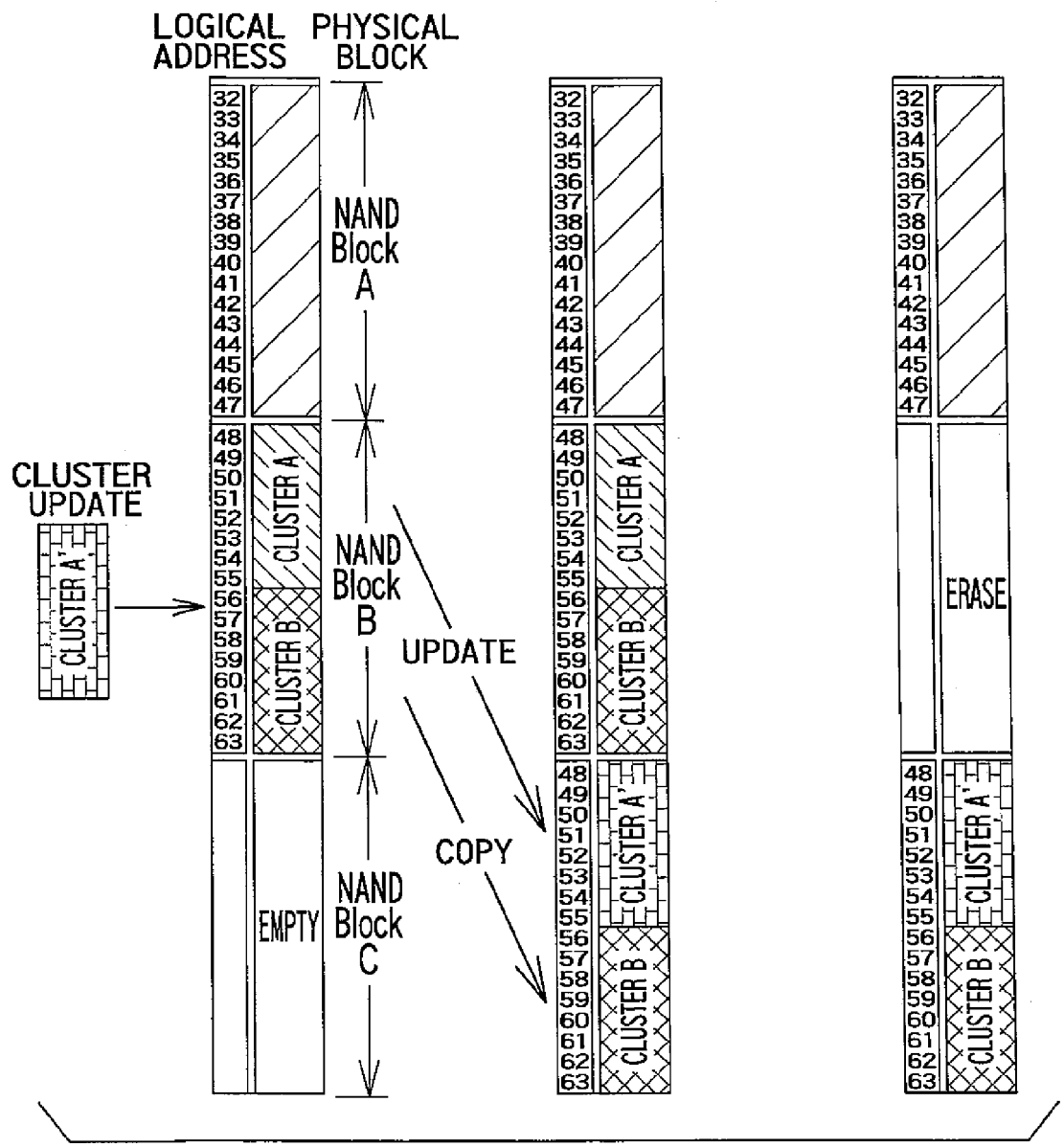
FIG. 38 is a chart showing a rewrite sequence according to the present invention.

First, referring to FIG. 38, an example of a write sequence in the case of a cluster size of 4 KB will be described. Since the cluster size is 4 KB, a write command for 8 continuous sectors is issued from the OS. At this time, write (data update) in logical sectors 48 through 55 (cluster A) is carried out.

(1) An erased new area is searched, and new data of logical sectors 48 through 55 are written in a new area NAND Block C.
(2) The original data of logical sector 56 through 63 are copied on the new area NAND Block C.
(3) The original block NAND Block B is erased.
(4) The logical address/physical address translation table is updated.

Therefore, if the rewrite is carried out for 8 sectors when viewed from the outside, logical sectors 48 through 63, i.e., 16 sectors in total (16 pages), are written and the NAND Block B, i.e., one block, is erased within the actual device.

Figure 39:
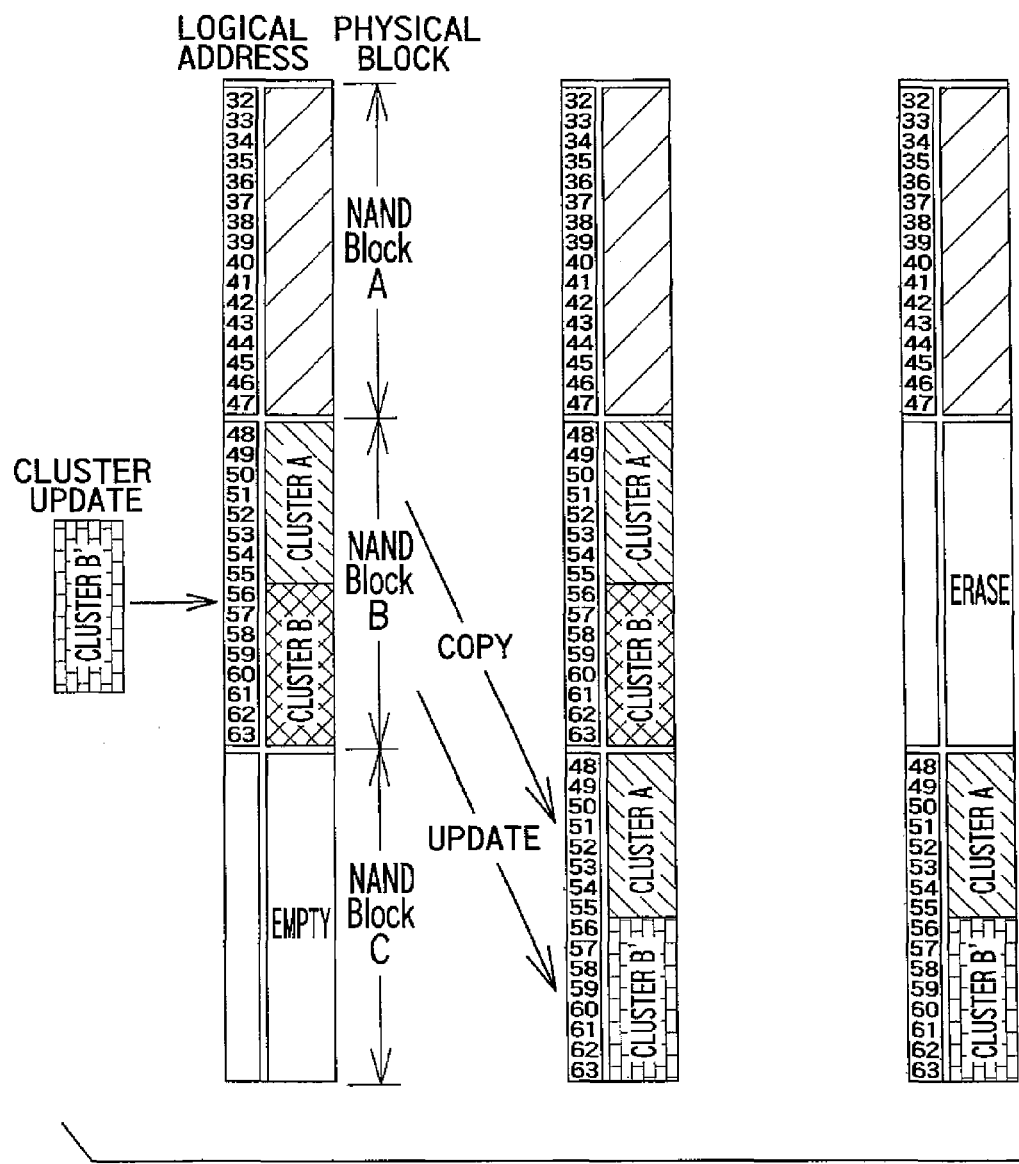
FIG. 39 is a chart showing a rewrite sequence according to the present invention.

Referring to FIG. 39, the write sequence in cluster B will be described below. In this case, the write (data update) in logical sectors 56 through 63 (cluster B) is carried out.

(1) An erased new area is searched, and the original data of logical sectors 48 through 55 are copied on the new area NAND Block C.
(2) New data of logical sectors 56 through 63 are written in the new area NAND Block C.
(3) The original block NAND Block B is erased.
(4) The logical address/physical address translation table is updated.

Therefore, if rewrite is carried out for 8 sectors when viewed from the outside, logical sectors 48 through 63, i.e., 16 sectors in total (16 pages), are written and the NAND Block B, i.e., one block, is erased within the actual device.

Figure 40:
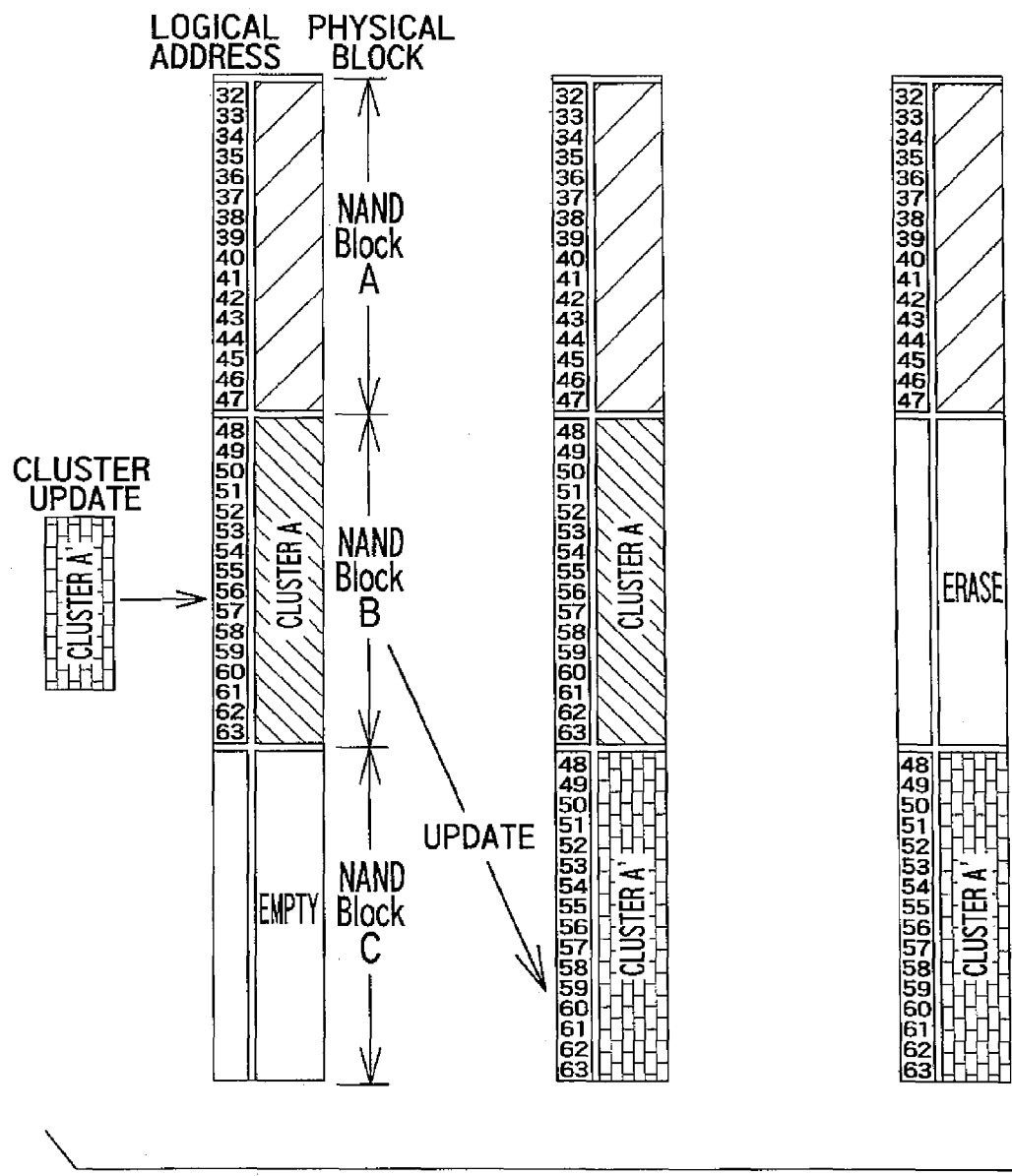
FIG. 40 is a chart showing a rewrite sequence according to the present invention.

Referring to FIG. 40, an example of a write sequence in the case of a cluster size of 8 KB will be described below. Since the cluster size is 8 KB, a write command for 16 continuous sectors is issued from the OS. At this time, write (data update) in logical sectors 48 through 55 (cluster A) is carried out.

(1) An erased new area is searched, and new data of logical sectors 48 through 63 are written in a new area NAND Block C.
(2) The original block NAND Block B is erased.
(3) The logical address/physical address translation table is updated.

Therefore, if rewrite is carried out for 16 sectors when viewed from the outside, logical sectors 48 through 63, i.e., 16 sectors in total (16 pages), are written and the NAND Block B, i.e., one block, is erased within the actual device.

Comparing the cluster size of 4 KB with the cluster size of 8 KB when the same 8 KB data are written, in the case of the cluster size of 4 KB, the processing is divided into two write operations, so that the write operation in 32 sectors in total and the erase operation from two blocks are carried out. On the other hand, in the case of the cluster size of 8 KB, the processing is concentrated on one writing, so that the write operation in 16 sectors in total and the erase operation from one block are carried out.

The rewriting speed of the conventional memory system shown in FIGS. 12 through 15 can be compared with the present strategy for the case of a cluster size of 4 KB. In the conventional memory system, the write operation for 48 sectors and the erase operation for three blocks are carried out to update 8 KB data. In the present memory system, the write operation for 32 sectors and the erase operation for two blocks are carried out to achieve the same result, so that the rewriting time can be reduced to two thirds. In the case of the cluster size of 8 KB, the conventional memory system performs a write operation for 32 sectors and an erase operation for two blocks to update 8 KB data, whereas the present memory performs a write operation for 16 sectors and an erase operation for one block, so that the rewriting time can be reduced to half according to the present invention.

Thus, the cluster delimiter serving as a unit of file management on the DOS does not straddle the boundary between physical blocks of the flash memory, so that the rewriting speed can be increased.

In addition, in the case of a cluster size of 4 KB, the write operation for 32 sectors and the erase operation for two blocks are carried out in order to update 8 KB data, whereas in the case of a cluster size of 8 KB, the write operation for 16 sectors and the erase operation for one block are carried out in order to update 8 KB data, so that the rewriting time is reduced to half That is, if the size of a cluster is the same size as that of a physical block, a high-speed write can be achieved. Also, if the size of a cluster is an integer times as large as the size of a physical block, the same advantage can be obtained.

The fourth preferred embodiment of the present invention will be described below.

In this preferred embodiment, there is provided a flash memory card, which improves the processing speed when a write command is executed after erase.

In the flash memory card system in this preferred embodiment, unlike the file erase in the ordinary DOS, a mark indicating that a corresponding file is invalid is put on a directory, and a memory area having been occupied by the corresponding file is not only open on a FAT (file allocation table), but the data division of the file body is erased on the flash memory. That is, when the erase of the file is commanded, the erase operation from the open cluster area is carried out.

Figure 41:
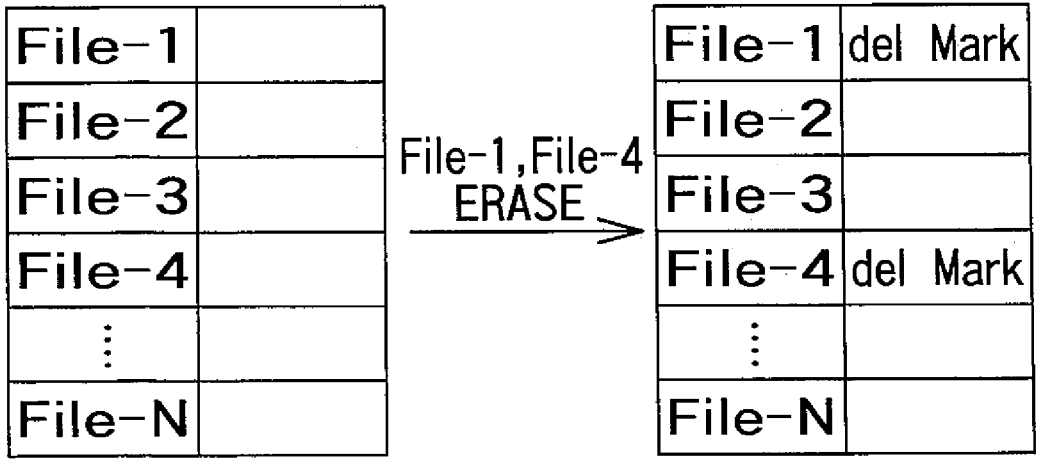
FIG. 41 is a table showing the relationship between a management area and a data area according to the present invention when an erase command is executed.

FIG. 41 shows the relationship between a management area and a data area when an erase command is executed. In FIG. 41, for example, when erase commands for File-1 and File 4 are executed, the File-1 and File-4 in the management area are open, and a del.mark is stored. In addition, the areas having stored File-1 and File-4 in the data area are erased.

Therefore, since the cluster selected when the next new file write command occurs has been erased, write can be immediately carried out, so that the file writing speed can be improved. Since the erasing time is generally longer than the writing time in the flash memory, it is possible to remarkably improve the file writing speed according to the present invention.

As can be seen from the above described third preferred embodiment, the advantage of this preferred embodiment is most remarkable when the cluster size is the same as the block size of the flash memory. When the cluster size is smaller than the block size of the flash memory, a part of a block is erased. In this case, the processing is not only complicated, but there are also some cases where it is not possible to erase only a part of a block on the specification. If the cluster size is the same as the block size, the cluster can be open by simply erasing the block. Also if the cluster size is an integer times as large as the physical block size, the same advantage can be obtained.

The present invention can be embodied in various ways without departing from the principle of the invention. For example, in this preferred embodiment, while the erase operation from the corresponding cluster in the data area has been executed when the file is erased, the execution timing for erase operation should not be limited thereto. For example, the erase operation from all the clusters may be executed when the format operation is executed. The memory card may be shipped after erasing the cluster in the data area. When a memory card is shipped, a shipping test for the memory card is generally carried out. If directories and FATs are rewritten when this test is completed, it is not only possible to obtain no file state, but it is also possible to achieve a high-speed file writing without the need of end user's correction when the memory card is delivered to the end user if the erase operation from the data area is executed according to this preferred embodiment.

In a case where the memory card is used for a digital still camera or the like, when operations including the erase of a file in the camera and the erase of an image file, such as a reformat, are carried out, if a cluster area storing the file body is erased simultaneously when the FAT and so forth are rewritten, it is possible to achieve a high-speed writing in the subsequent image writing sequence, so that it is possible to continuously take pictures and to capture moving pictures. In this case, if the cluster size is an integer times as large as the block size and if the cluster delimiter is coincident with the delimiter of block size, the file body part can be easily erased. In addition, unnecessary file parts may be automatically erased when a power supply is turned on in a digital camera or the like. Thus, it is also possible to increase the writing speed without giving the user trouble, with respect to a memory card wherein the file erase has been carried out by simply updating the FATs and so forth in a personal computer. This timing should not be limited to the time when the power supply is turned on, but it may be any time. The writing speed can also be increased when the memory card of the present invention is used for a computer system or the like.

In addition, according to this preferred embodiment, since it is possible to reduce the numbers of erase and write operations occurring when data are rewritten, it is also possible to increase the life of a flash memory when a flash memory having a limited number of rewrite operations is used.

As described above, according to the memory system control method in this preferred embodiment, the cluster delimiter serving as a unit of file management on the DOS does not straddle the boundary between physical blocks, so that it is possible to reduce the numbers of erase and write operations occurring when data are rewritten, thereby increasing the rewriting speed. Moreover, when a flash memory having a limited number of rewrite operations is used, it is possible to increase the life of the memory.

The fifth preferred embodiment of the present invention will be described in detail below.

In this preferred embodiment, there is provided a flash memory card, which reduces the capacity of a RAM area required for a logical address/physical address translation table.

In this preferred embodiment, when a logical address/physical address translation table is prepared, access from a host is divided into two kinds. For example, it is assumed that case 1 is a state accessing the first half 250 logical blocks of 500 logical blocks and that case 2 is a state accessing the second half 250 logical blocks of 500 logical blocks. In case 1, a table of the first half 250 blocks is held in the logical address/physical address translation table. In case 2, a table of the second half 250 blocks is held in the logical address/physical address translation table. FIG. 42(*a*) shows the state of the table in the case 1, and FIG. 42(*b*) shows the state of the table in the case 2.

Assuming that the table of the first half 250 logical blocks exists on the table in a certain moment, if the range accessed from the host is a range of the first half 0 through 249 logical blocks, it is possible to search the correspondence between the logical blocks and the physical blocks by using the existing table.

Similarly, assuming that the table of the second half 250 logical blocks exists on the table in a certain moment, if the range accessed from the host is a range of the second half 250 through 499 logical blocks, it is possible to search the correspondence between the logical blocks and the physical blocks by using the existing table.

Then, assuming that the table of the first half 250 logical blocks exists on the table in a certain moment, if the range accessed from the host is a range of the second half 250 through 499 logical blocks, it is not possible to search the correspondence between the logical blocks and the physical blocks by using the existing table. Therefore, in this case, the logical address/physical address translation table corresponding to the second half 250 logical blocks is remade. This needs to refer to all the areas of the flash memory again.

Similarly, assuming that the table of the second half 250 logical blocks exists on the table in a certain moment, if the range accessed from the host is a range of the first half 0 through 249 logical blocks, it is not possible to search the correspondence between the logical blocks and the physical blocks by using the existing table. Therefore, in this case, the logical address/physical address translation table corresponding to the first half 250 logical blocks is remade. This needs to refer to all the areas of the flash memory again.

Thus, if the logical address/physical address translation table corresponding to the area accessed from the host does not exist on the RAM, the required logical address/physical address translation table is remade by referring to all the areas of the flash memory again.

Figure 43:
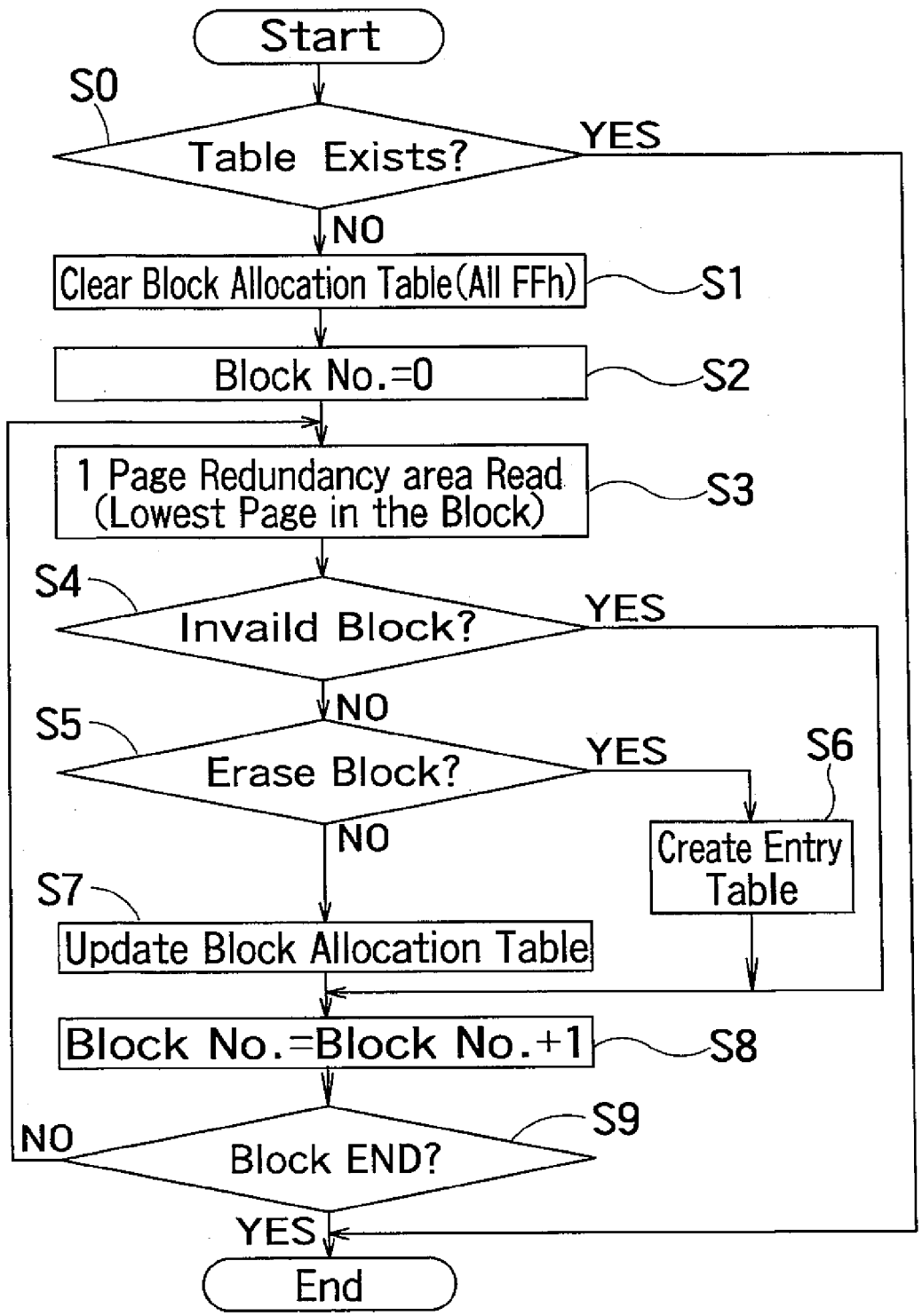
FIG. 43 is a flow chart of an example of a method for preparing a logic block/physical block translation table in this preferred embodiment.

FIG. 43 shows a flow chart for preparing the logical address/physical address translation table in this case.

(Step S0) The presence of a required logical address/physical address translation table is checked at the beginning of access, and if it is required, the routine goes to a table preparing routine.

(Step S1) A RAM area for storing therein a logical address/physical address translation table is reset.

(Step S2) Search is started from the top of a physical block.

(Step S3) The redundant division of the block is read out.

(Step S4) On the basis of data in a predetermined area, it is determined whether the block is a normal block.

When the block is a defective block, the subsequent processes are not required, and the search for the next block is carried out.

(Step S5) It is determined whether the block is an erased area.

(Step S6) If the block is an erased area, it is stored on the table as a proposed block used for the next write.

(Step S7) If the block is not an erased area, a logical address information area is extracted.

(Step S8) A logical address/physical address translation table is prepared on the basis of the above described contents.

(Step S9) The physical block number is counted up.

After the search for all the blocks is completed, the routine ends.

In accordance with the above described operations, the logical address/physical address translation table is prepared if necessary.

The present invention should not be limited to the above described preferred embodiment, but the invention can be embodied in various ways without departing from the principle of the invention.

For example, in the above described preferred embodiment, while the flash memory has been divided into two parts, the first and second halves, the present invention should not be limited thereto, but the flash memory may be divided into an optional number of parts.

In addition, in the above described preferred embodiment, while the flash memory has been divided into the first and second halves having the same size, the present invention should not be limited thereto.

Thus, the number and size of divided parts may be optionally determined.

It is not always required to hold only one table when the flash memory is divided into three or more areas. For example, it is assumed that the flash memory card serves as a device of the DOS to store therein an image file or the like. In the top of an ordinary device, there are file management areas, i.e., a master boot sector, a partition boot sector, a file allocation table (FAT) and a directory area. These file management areas are frequently accessed each time the update or access of the file is carried out. In this case, the area corresponding to the file management area is one area, and each of other file data storing areas are divided into two parts. The logical address/physical address translation table corresponding to the file management area may always be held. In this case, when a file is written in the second half of the logical address, it is not required to alternately frequently remake the file management area and the second half of the logical address, so that it is possible to prevent the deterioration of performance. While the file management area has been described, the same advantage can be obtained if the table is always held for areas other than the file management area.

As described above, according to this preferred embodiment, all of the correspondence relationships between logical blocks and physical blocks must not be always held on the RAM, and the correspondence relationship of only a required area is prepared on the RAM in the system one by one in accordance with the access from the host. Therefore, in comparison with the case where the correspondence relationships in all the areas are always held on the RAM, it is possible to reduce the minimum required RAM area, and it is possible to control the memory only by the integrated RAM of the general purpose CPU although this has not been able to be achieved. Thus, it is possible to greatly reduce costs in comparison with a conventional system having an external RAM.

The sixth preferred embodiment of the present invention will be described in detail below.

In this preferred embodiment, there is provided a flash memory card, which reduces the capacity of a RAM area required for a logical address/physical address translation table.

In this preferred embodiment, a physical block address of the flash memory is divided into a plurality of logical areas (which will be hereinafter referred to as "zones"). In this case, the number of physical blocks allocated to each zone, i.e., the capacity of each zone, may be uniform or non-uniform. In addition, the number of zones may be one or plural. Moreover, the number of zones may be even or odd.

Figure 44:
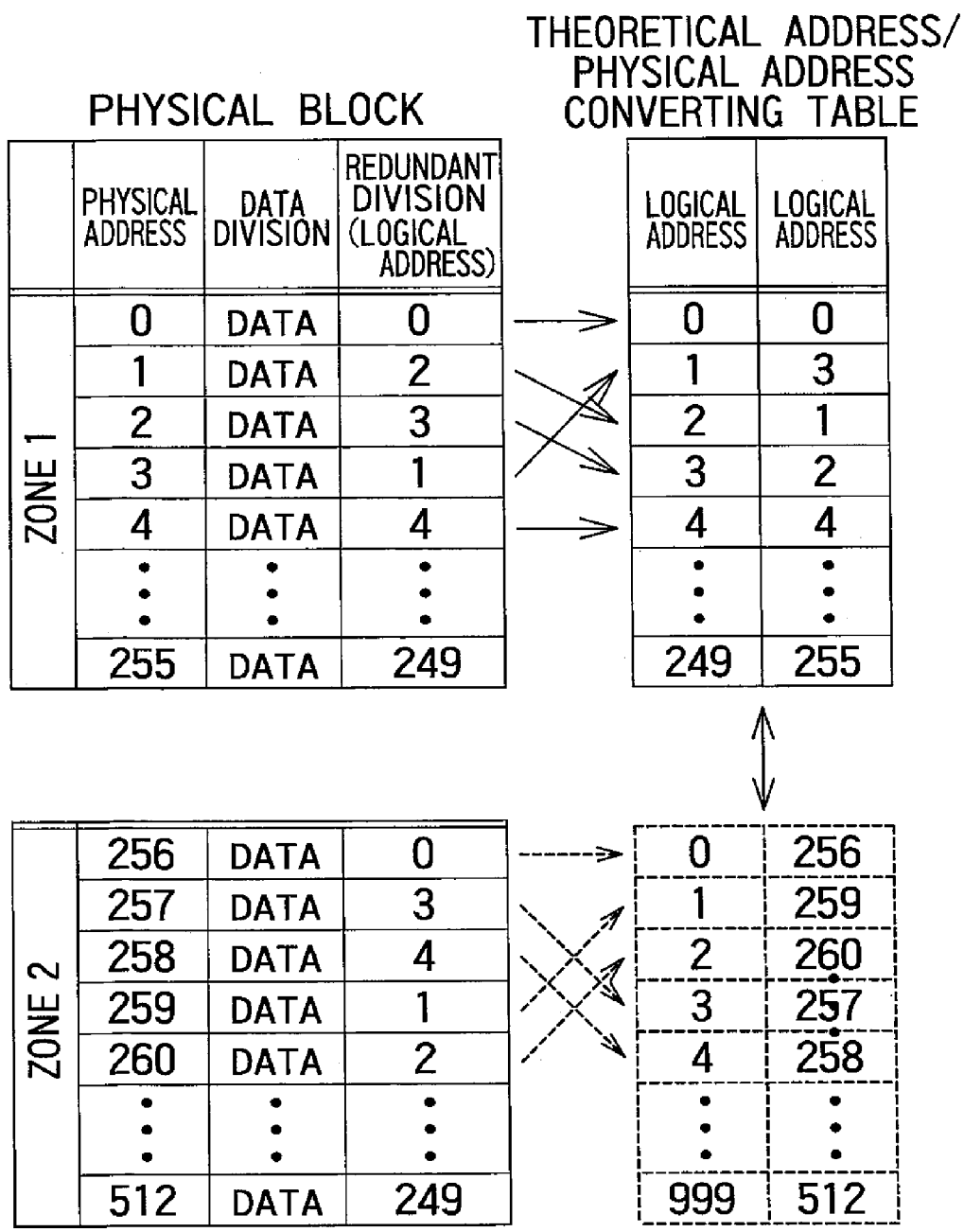
FIG. 44 is a logical/physical block translation table in the preferred embodiment.

FIG. 44 shows the structure of a physical block and the relationship between logical addresses and physical addresses when a 16-Mbit NAND-type flash memory is divided into two zones having the same capacity.

When the host controls the flash memory, the number of required logical blocks is defined to be 500, and the values of logical block addresses are 0 through 499. The redundant division of a physical block stores therein a logical block address information indicating which logical block the data held in the physical block correspond to. In this preferred embodiment, logical block addresses are given from 0 in series for each zone. Therefore, logical block addresses 0 through 249 are allocated to zone 1, and each of logical blocks corresponds to any one of 256 physical blocks of physical block addresses 0 through 255. In addition, any one of logical block addresses 0 through 249 is stored in the redundant division of a physical block. Moreover, logical block addresses 250 through 499 are allocated to zone 2, and each of logical blocks corresponds to any one of 256 physical blocks of physical block addresses 256 through 511. In addition, any one of logical block addresses 0 through 249 is stored in the redundant division of a physical block.

An additional write system during data update is executed in a zone including a logical block address to be updated, and a physical block having data corresponding to a certain logical block is not fixed and is always moving in each zone.

In this preferred embodiment, usually when a power supply is turned on, the logical block address information stored in the redundant divisions of all the physical blocks in the zone is searched, and a translation table between logical blocks and physical blocks is prepared on a system RAM. The zone prepared on the RAM may be any one of the available zones. Usually, when the flash memory is used under the control of the DOS, the FATs and directory areas serving as management information services are arranged in the first zone, so that it is efficient to prepare the table of the top zone. In addition, the table prepared on the RAM should not be limited to one zone, but it may be prepared for a plurality of zones so far as the RAM capacity permits.

A process for preparing a translation table for an access demand from a host will be described below. An area including physical block addresses 0 through 255 is called zone 1. In addition, an area including physical block addresses 256 through 511 is called zone 2. The host remembers which zone belongs to the translation table currently prepared on the RAM.

When a translation table of zone 1 is prepared on the RAM and when an access demand for logical block address 128 is made, the procedure will be described below.

(1) If n is derived so that logical block address $128-250\times(n-1)<250$, n=1, so that it can be seen that the translation table of zone 1 is required.

(2) Since the translation table on the RAM is zone 1, no table is prepared.
(3) Since the values of addresses on the translation table are 0 through 249, an address to be accessed on the translation table is derived from logical block address 128 demanded by the host. From 128−250×(1−1)=128, a physical block address corresponding to address 128 on the translation table may be accessed.
(4) When rewrite occurs, the translation table is updated to get ready for the next access.

Then, when a translation table of zone 1 has been prepared on the RAM and when an access demand for logical block address 324 is made, the procedure will be described below.
(1) If n is derived so that logical block address 324−250×(n−1)<250, n=2, so that it can be seen that a translation table of zone 2 is required.
(2) Since the translation table in the RAM is for zone 1, the logical block address information of the redundant divisions of physical block addresses 256 through 511 included in zone 2 is searched, and the translation table of zone 2 is prepared on the RAM.
(3) Since the values of addresses on the translation table are 0 through 249, an address to be referred on the translation table is derived from logical block address 324 demanded by the host. From 324−250×(2−1)=74, a physical block address corresponding to address 74 on the translation table may be accessed.
(4) When rewrite occurs, the translation table is updated to get ready for the next access.

As described above, if the translation table is prepared in accordance with the accessed logical block, it is possible to easily reduce the RAM area in comparison with the conventional RAM area. Also, when the table of zone 2 has been prepared on the system RAM, it is possible to easily access a target address by the similar process.

When the logical address/physical address translation table is prepared, the translation table between logical blocks and physical blocks is prepared on the RAM. At this time, since a zone number to be prepared is known, the values of physical block addresses on the translation table may be 0 through 255. When the physical block is actually accessed, it is possible to easily obtain a new physical block address to be inputted to the flash memory by adding 256×zone number to the physical address on the translation table as OFFSET.

When a 16-Mbit NAND-type flash memory is used, the conventional control method requires 9 bits to express a physical block address, and uses 2 bytes for convenience of a software. In this preferred embodiment, as shown in FIG. 45, a physical block address may be expressed by 8 bits, i.e., 1 byte. Therefore, the RAM capacity, which has conventionally required 1 Kbyte, can be reduced to half. If a logical block address increases, the capacity of the logical address/physical address translation table increases. Therefore, the advantages of this preferred embodiment increases as the capacity of the flash memory increases.

In addition, according to this preferred embodiment, a large-capacity flash memory can be controlled by a block address, which can be stored in the Block Address Area of the redundant division of the physical block shown in FIG. 11. That is, if one zone is divided so as to be formed by a physical block of a block address value, which can be stored in the Block Address Area of the redundant division, it is possible to correspond to a large-capacity logical address.

FIG. 46 shows the structure of a physical block when a 16-Mbit NAND-type flash memory is divided into four equal capacity zones.

When the host controls the flash memory, the number of required logical blocks is defined to be 500, SO that the values of logical block addresses are 0 through 499. The redundant division of the physical block stores therein a logical block address information indicating which logical block corresponds to the data held in the physical block. In this preferred embodiment, the logical block addresses are given in series from 0 for each zone. Physical block addresses corresponding to these logical block addresses are as follows. The logical block addresses 0 through 124 are allocated to zone 1, and each of the logical blocks corresponds to any one of 128 physical blocks having physical block addresses 0 through 127. The logical block addresses 125 through 249 are allocated to zone 2, and each of the logical blocks corresponds to any one of 128 physical blocks having physical block addresses 128 through 255. The logical block addresses 126 through 374 are allocated to zone 3, and each of the logical blocks corresponds to any one of 128 physical blocks having physical block addresses 256 through 383. The logical block addresses 384 through 499 are allocated to zone 4, and each of the logical blocks corresponds to any one of 128 physical blocks having physical block addresses 384 through 511.

The additional write system during data update is executed only in a zone including a logical block to be written, and a physical block storing therein data corresponding to a certain logical block address is not fixed and is always moving in the zone. The redundant division of each physical block address stores therein a logical block address information indicating which logical block address the data held in the physical block belong to.

As described above, 125 logical blocks are allocated to each zone, and 128 physical blocks are allocated to each zone. If a physical block is divided into four zones as described above, it is possible to obtain the same advantages as those in the case where a physical block is divided into two zones.

An example of redundancy operation in this preferred embodiment in the case of the physical block divided into four zones will be described below.

Before describing the redundancy operation in this preferred embodiment, the redundancy operation of a 16-Mbit NAND-type flash memory as an example of a conventional flash memory, which does not carry out the division of a physical block into zones, will be described. As shown in FIG. 2, the 16-Mbit NAND-type flash memory has 512 physical blocks, and as shown in FIG. 3, the number of logical blocks viewed from the host is defined to be 500. In addition, one block must be provided for storing therein information for easily constructing a PC card ATA interface, and one block must be provided for adopting the additional write system. Therefore, 502 blocks must be provided for controlling this flash memory. Accordingly, the 16-Mbit NAND-type flash memory permits the existence of up to 10 defective blocks.

However, the flash memory has the upper limit of the number of rewrite operations. When the flash memory is used, a defective block may be produced therein. Therefore, in order to ensure a sufficient storage region, the flash memory must have a writable and erasable effective block as a block replaced when the defective block is produced. In addition, there is a problem in that a flash memory having 10 or more defective blocks can not be shipped since it does not have a sufficient capacity when it is shipped, so that the yield of products is decreased.

For that reason, the 16-Mbit NAND-type flash memory is provided with a plurality of redundant blocks in addition to 512 body blocks, in order to ensure a large number of effective blocks to be prepared for the occurrence of defective blocks in the flash memory and in order to improve the yield of products when the flash memory is shipped. These redundant blocks replace defective blocks, which have been produced in the 512 body blocks, by means of a redundant circuit as a hardware when the flash memory is shipped. When the redundant circuit is used, the redundant blocks are allocated to addresses of defective blocks. After the replacement in hardware, if the address of a defective block is selected, the replacement redundant block is selected. Since the number of the redundant blocks is not infinite, a defective block, which has not been replaced when the flash memory is shipped, is treated as an innate defective block. In addition, a defective block, which is produced when the flash memory is used by the user, is treated as an acquired defective block. These innate and acquired defective blocks are relieved by the effective blocks.

Figure 47:
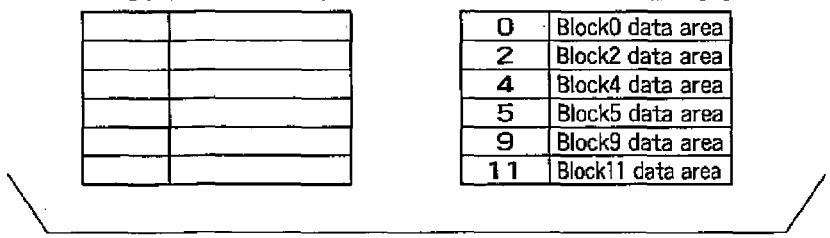
FIG. 47 is a table for explaining a conventional example of a replacement of a defective block with a redundant block.

The replacement of the body blocks and redundant blocks is usually carried out by means of the redundant circuit as a hardware. As shown in FIG. 47, the replacement is carried out sequentially from a defective block having a small block address or a large block address for convenience of replacement operation. Therefore, after the replacement of blocks, there are blocks, which can be written or erased sequentially from a small block address or a large block address.

Thus, as described above, the conventional flash memory control method requires 500 logical blocks, one block for storing therein information for easily constructing a PC card ATA interface, and one block as an empty area to use the additional write system, with respect to 512 physical blocks. Thus, the conventional flash memory can be controlled if it has 502 rewritable blocks. Therefore, the conventional control method permits 10 defective blocks with respect to 512 physical blocks.

The redundancy operation in this preferred embodiment will be described below. With respect to zone 1, one block for storing therein information for easily constructing a PC card ATA interface is required, and one block as an empty area is required since the additional write system is adopted. Therefore, with respect to 125 logical blocks, 127 rewritable physical blocks are required, and the number of defective blocks, which are permitted in the zone and which can not be rewritten, is up to 1. With respect to zones 2 through 4, since additional one block is required as an additionally writing empty block, 126 rewritable physical blocks are required, and the number of defective block, which are permitted in the zone and which can not be rewritten, is up to 2. In order to simplify the explanation, it is assumed that the number of defective blocks permitted with respect to zones 1 through 4 is 1. Therefore, the specification of the number of permitted defective blocks is very severe in comparison with the specification of the number of defective blocks permitted by the conventional control method.

In the 16-Mbit NAND-type flash memory shown in FIG. 46, it is assumed that, for example, 7 blocks having block addresses 2, 5, 129, 131, 132, 385 and 389 are defective blocks, and that the flash memory has four redundant blocks. As shown in FIG. 46, when the redundant circuit is used and when defective blocks are replaced with redundant blocks in sequence from a defective block having a small block address similar to the conventional method, the defective blocks after replacement are three blocks having physical block addresses 132, 385 and 389. These blocks are regarded as innate blocks, and innate defective block marks are put on the redundant divisions of the blocks. Since up to 10 innate defective blocks are permitted in the conventional control method, there is particularly no problem to control the flash memory. However, when it is premised that the flash memory is divided into zones to be controlled, two defective blocks having physical block addresses 385 and 389 exist in zone 4, so that it is not possible to control the flash memory and it is not possible to ship this product.

Thus, when defective blocks exist in the flash memory in this preferred embodiment, if the replacement is carried out sequentially from a defective block having a small block address or a large block address for simple convenience of replacement operation similar to the conventional flash memory, it is not possible to ensure required good blocks, and the possibility of occurrence of unusable zones is increased.

Thus, in this preferred embodiment, when the flash memory is divided into zones to be controlled, the defective blocks existing in each zone are replaced with redundant blocks so that all the zones meet the number of effective blocks.

FIG. 48 shows the state of a physical block when defective blocks existing in each zone are replaced with redundant blocks so that the number of defective blocks exceeds the number permitted in each zone. Similar to the flash memory shown in FIG. 46, the flash memory shown in FIG. 48 has seven defective blocks having block addresses 2, 5, 129, 131, 132, 385 and 389 and four redundant blocks. It can be seen that it is possible to ship products, which can not be shipped by the conventional replacement method, as good product. An example of replacement procedure will be described below.

(1) Zones 1 through 4 are searched, and the following variables are derived.
Defective physical block addresses are extracted.
$Z(n)$ $BA(m)$ ($n=1\sim4$, $m=1\sim$the number of defective blocks in each zone)
The number of defective blocks for each zone is derived.
$Z(n)$ $BN$ ($n=1\sim4$)
(2) Even if all of redundant blocks are used with respect to one of $n=1\sim4$ of $Z(n)$ $BN$, if at least one does not meet the number of effective blocks, the replacement is not carried out and the operation ends.
(3) Among $n=1\sim4$ of $Z(n)$ $BN$, the maximum n is extracted.
(4) With respect to n extracted in (3), a block corresponding to a physical block stored in $Z(n)$ $BA(m)$ with respect to the minimum or maximum m for storing therein a block address information among $Z(n)$ $BA(m)$ ($m=1\sim$the number of defective blocks in the zone) is replaced with a redundant block.
(5) $Z(n)$ $BN=Z(n)$ $BN-1$
(6) With respect to m selected in (3), the block address information of $Z(n)$ $BA(m)$ is deleted.
(7) The processes (3) through (6) are repeated. After all the redundant blocks are used, the process (9) is carried out.
(8) If $Z(n)$ $BN$ ($n=1\sim4$) are equal to each other, (3) through (7) are repeated with respect to the zone of the minimum or maximum n.
(9) $Z(n)$ $BN$ ($n=1\sim4$) is checked. When n exceeding the specification exists, the product is regarded as a defective.
(10) End Various methods for replacing body blocks with redundant blocks may be considered. While the flash memory has been divided into four zones in this preferred embodiment, it may be divided into two zones or odd zones. In addition, the capacities (the number of blocks) of divided zones may be different. In either case, in this preferred embodiment, body blocks are replaced with redundant blocks while monitoring the number of defective blocks existing in each zone so that the number of defective blocks existing in each zone after replacement operation exceeds the number of defective blocks permitted in each zone, and the replacement procedure may be modified without departing from the principle of the invention.

As described above, according to this preferred embodiment, since a table is prepared every zone serving as an object to be accessed unlike conventional methods using a table wherein logical blocks have a one to one correspondence with physical blocks of a flash memory, it is possible to reduce a RAM area required for the table, and it is possible to control a memory only by means of an integrated RAM of a general purpose CPU although this can not be achieved by the conventional method, so that it is possible to considerably reduce costs in comparison with conventional methods using an external RAM. In particular, these advantages are remarkable when a non-volatile semiconductor memory having a large number of physical blocks is controlled. In addition, it is possible to cope with a large-capacity logical address by a bit number determined by a Block Address Area of a redundant division of a physical block.

In addition, according to this preferred embodiment, in a flash memory for use in a system using a control method for allocating a plurality of physical blocks to a plurality of logical zones to prepare a translation table between logical blocks and the physical blocks every zone to carry out memory access, defective blocks of the body are replaced with redundant blocks while monitoring the number of defective blocks existing in each zone so that the number of defective blocks existing in each zone after replacement exceeds the number of defective blocks permitted for each zone, although the replacement has been carried out sequentially from a small (or large) address in conventional methods. Therefore, it is possible to reduce the number of products, which can not be shipped since the products have unusable zones, so that it is possible to improve the yield of products.

The seventh preferred embodiment of the present invention will be described below.

In this preferred embodiment, there is provided a flash memory card, which can support any types of binary/multi-valued flash memories.

Figure 1:
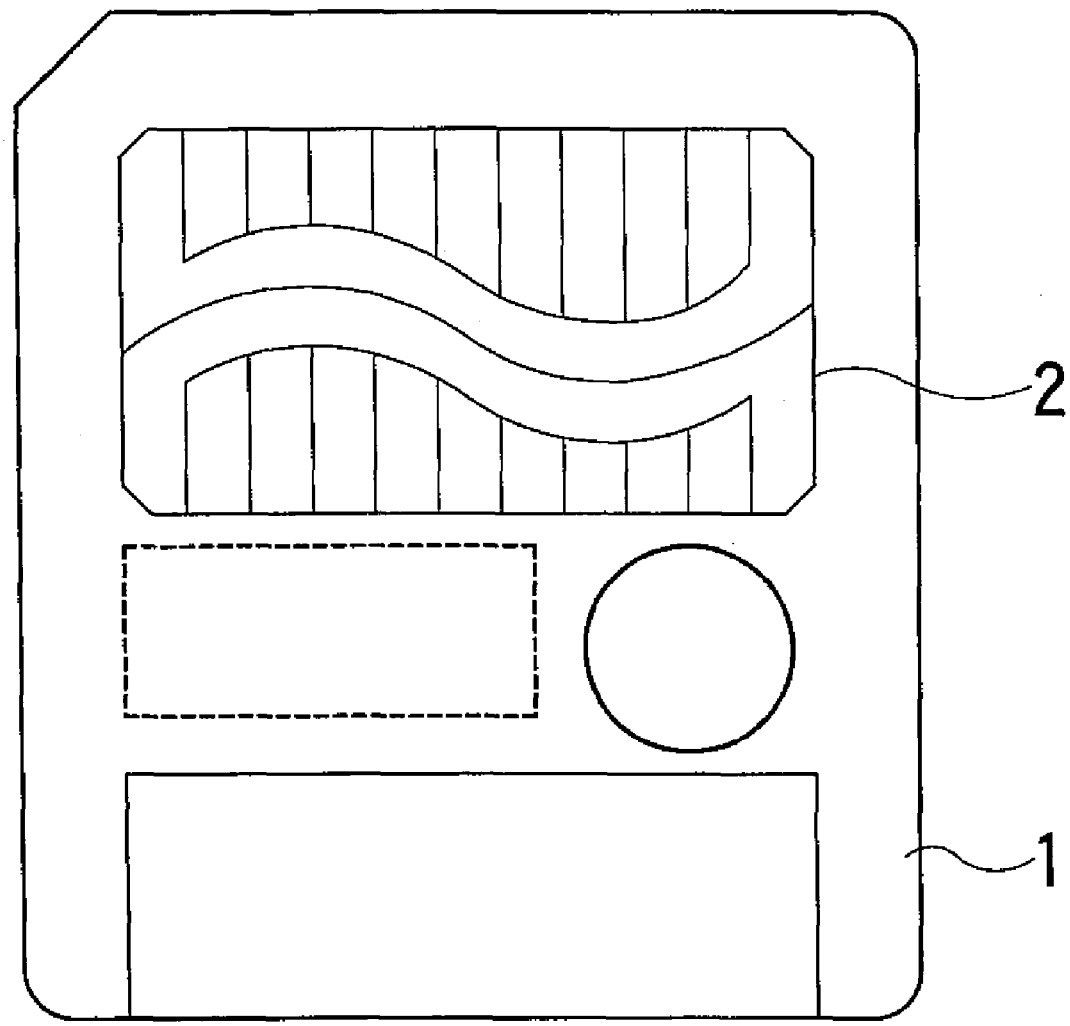
FIG. 1 is an outside drawing of a memory card.
Figure 8:
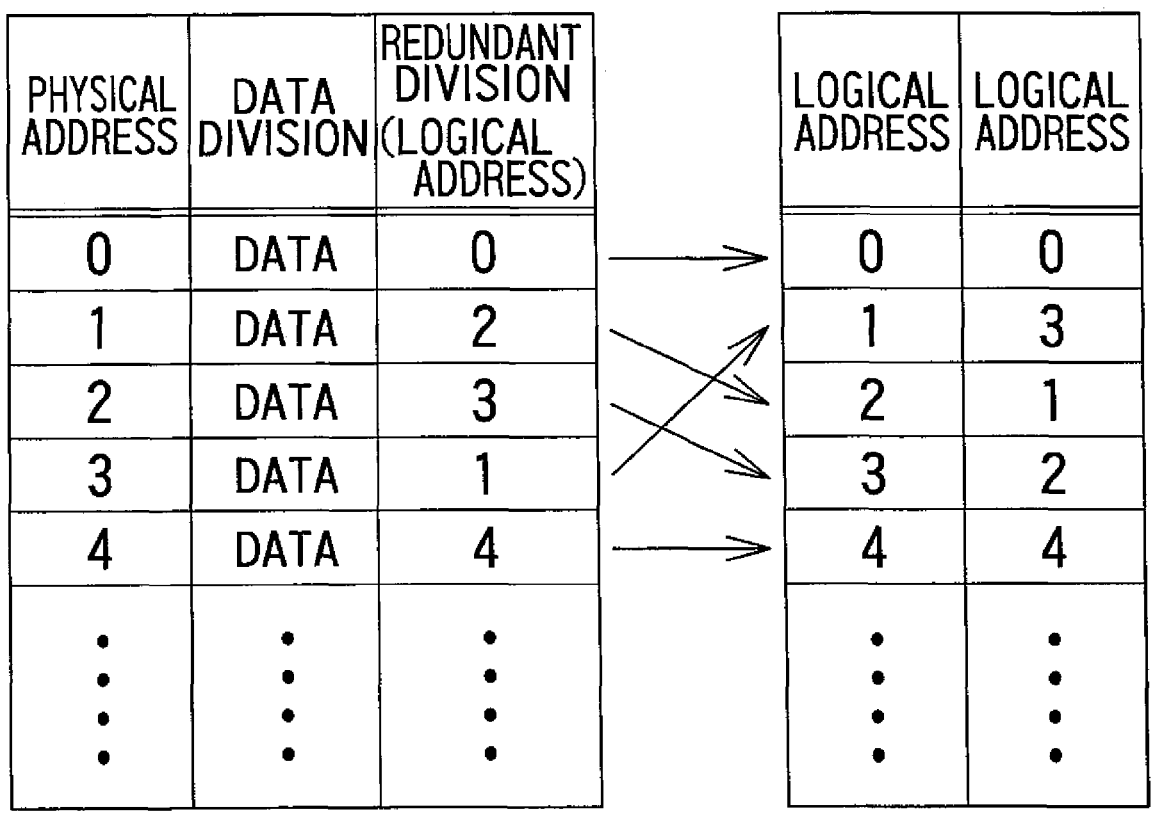
FIG. 8 is a conventional logical/physical block translation table.
Figure 12:
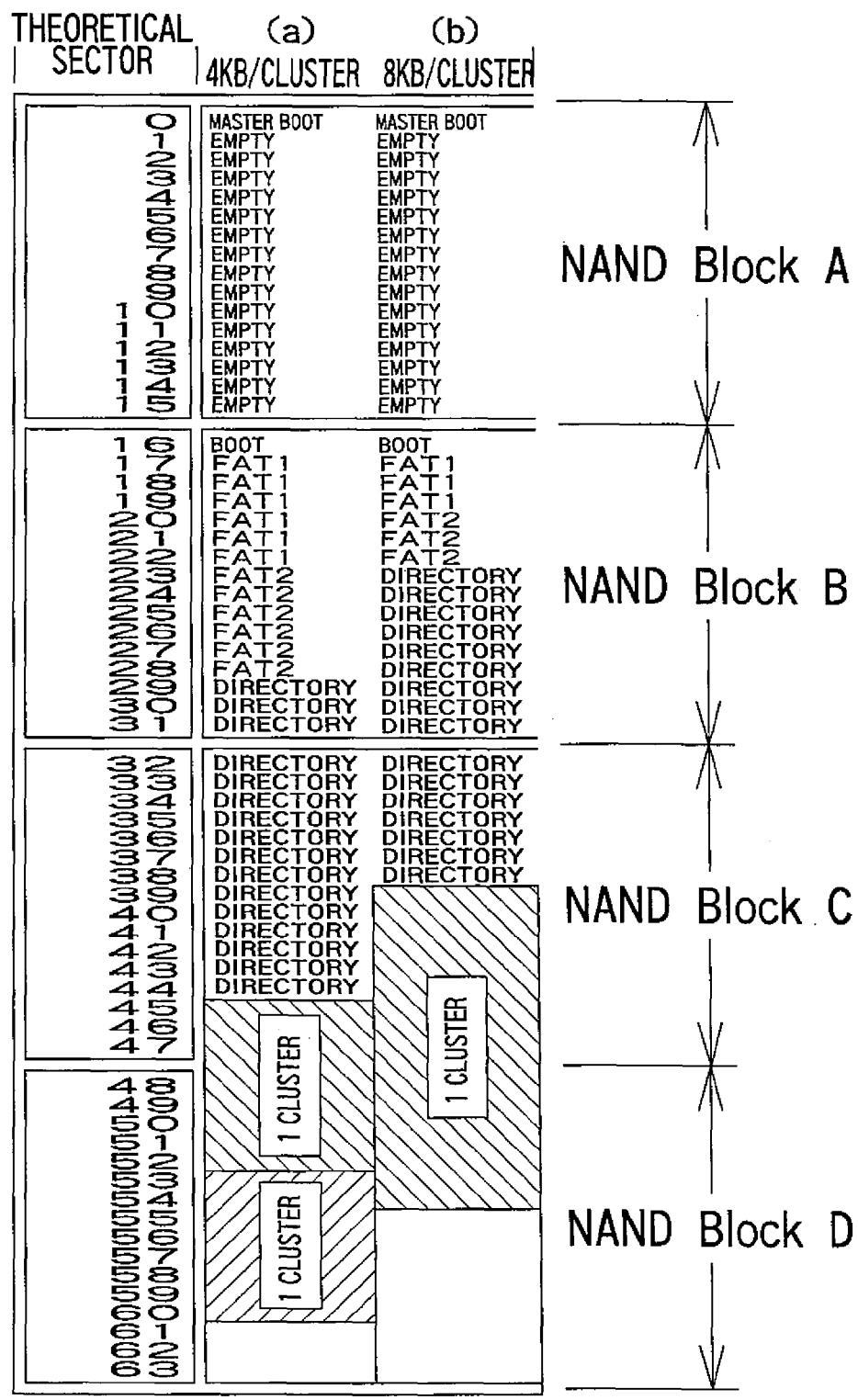
FIG. 12 is a table showing parameters in a conventional DOS format.
Figure 13:
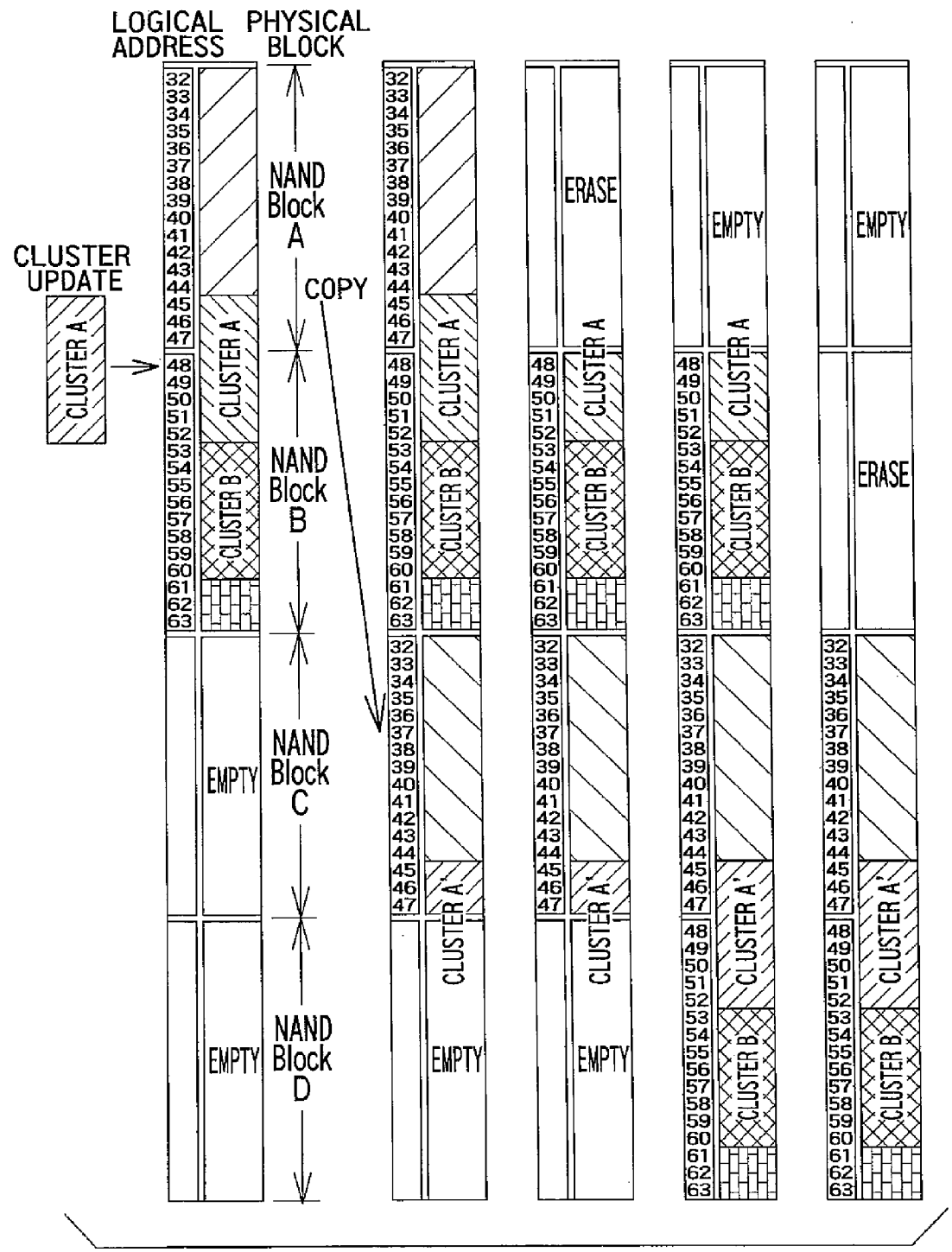
FIG. 13 is a chart showing a conventional rewrite sequence.
Figure 14:
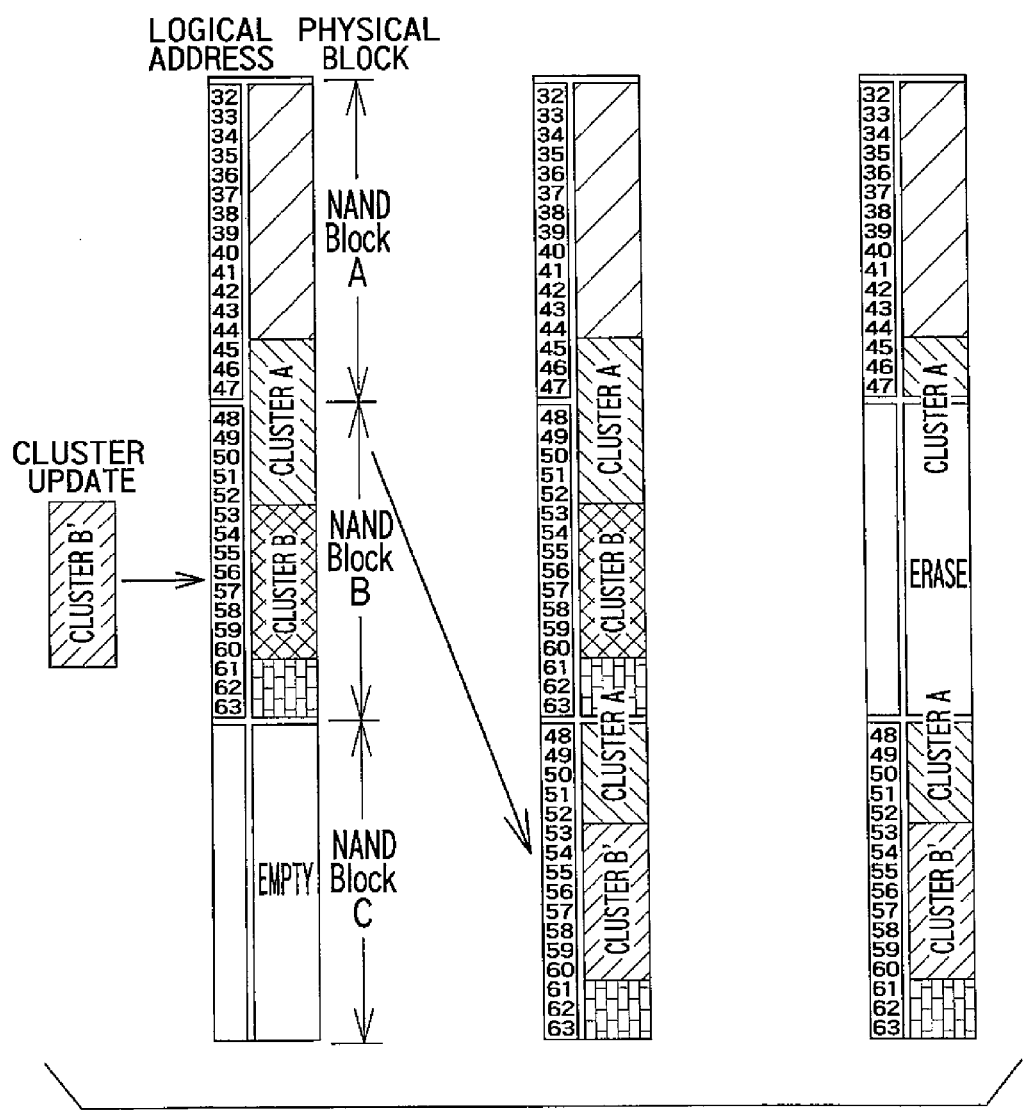
FIG. 14 is a chart showing a conventional rewrite sequence.
Figure 15:
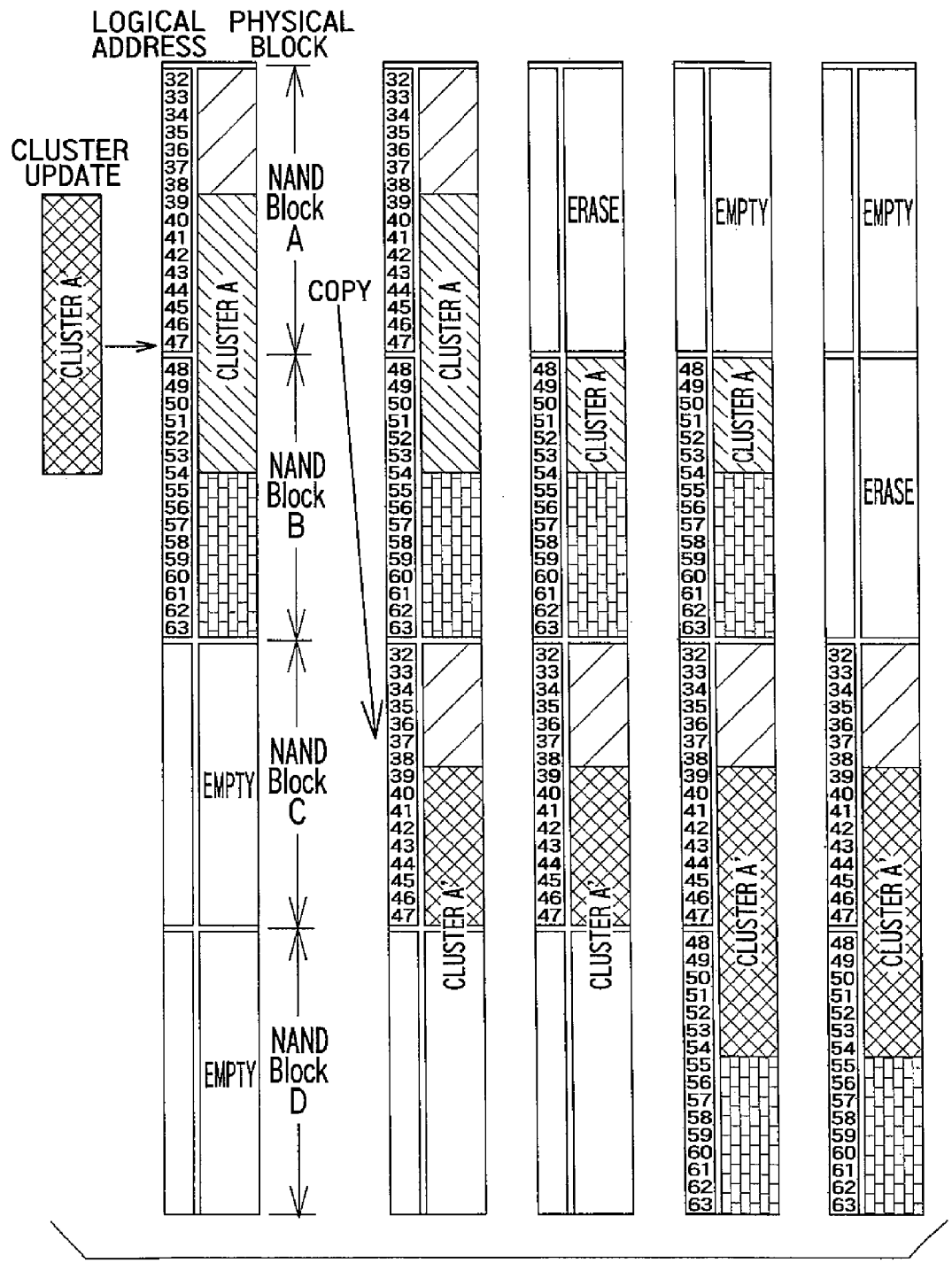
FIG. 15 is a chart showing a conventional rewrite sequence.
Figure 17:
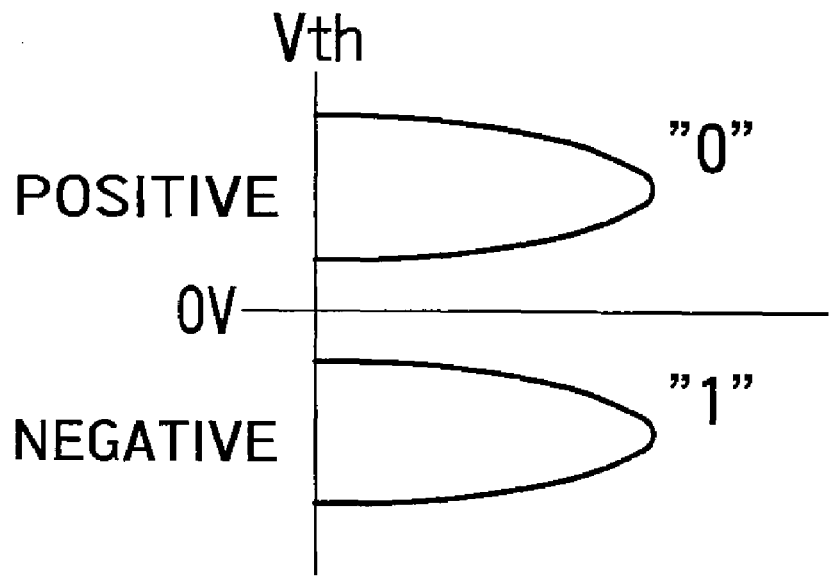
FIG. 17 shows an example of how single-bit per cell data are stored in a flash memory.
Figure 18:
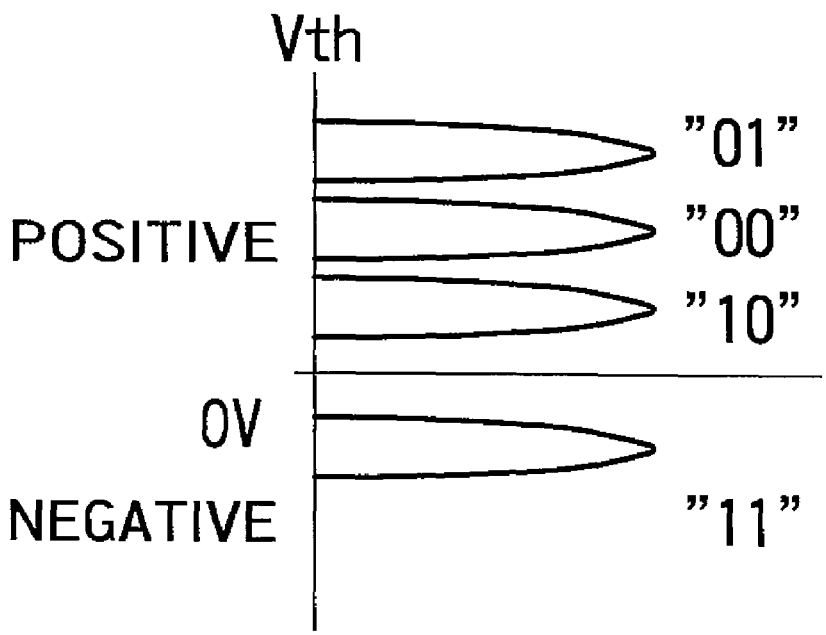
FIG. 18 shows an example of how multi-bit per cell data are stored in a flash memory.
Figure 19:
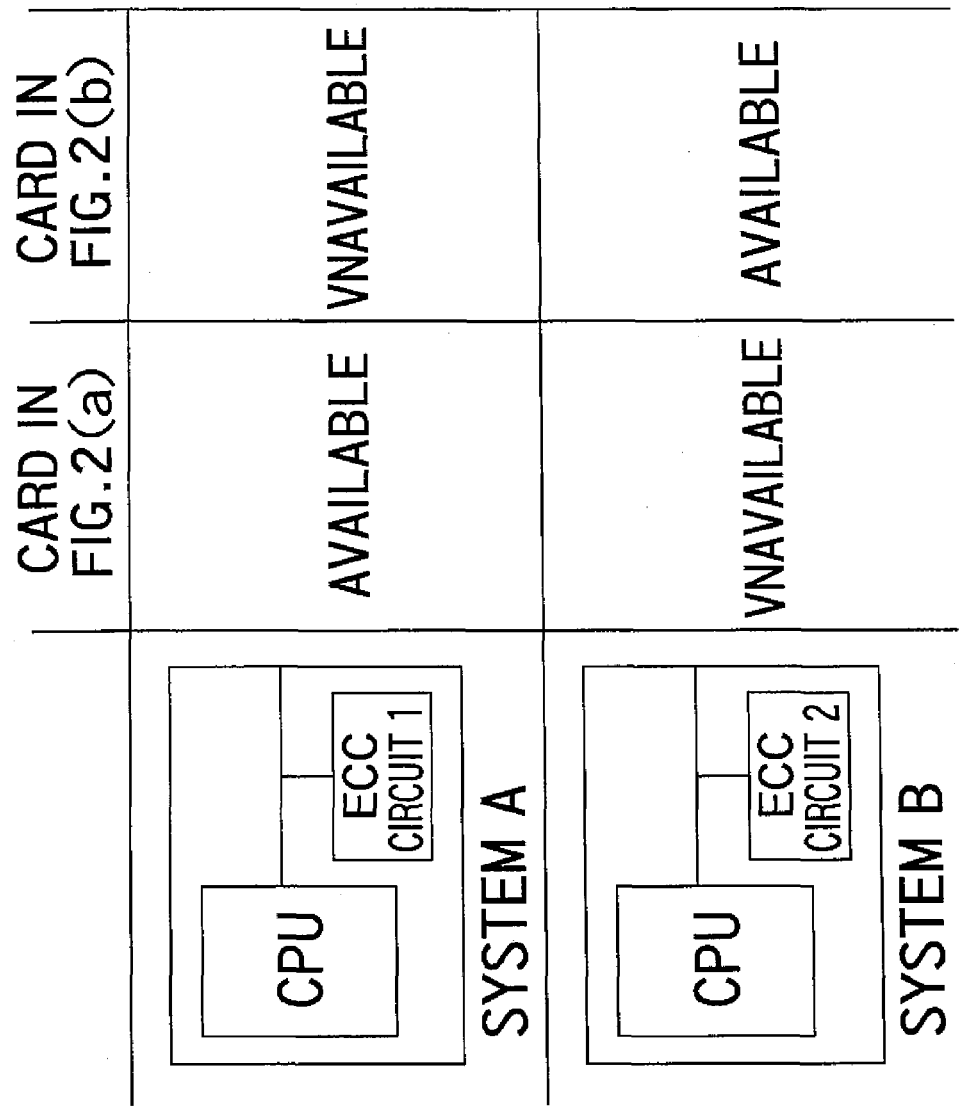
FIG. 19 is a table showing a conventional system.

FIG. 49 is a schematic view of a PC card adapter, to which this preferred embodiment is applied. A flash memory card 101A is a binary flash memory card shown in FIG. 17, and a flash memory card 101B is a four-valued flash memory card shown in FIG. 18. A PC card adapter 102 is provided for transferring the data of the flash memory cards 101A and 101B. The PC card adapter 102 has a 68-pin connector for a PC card slot, and a connector for a flash memory card. In the PC card adapter 102, there is provided a controller 103 for controlling the flash memory card and for electrically interfacing with the PC card slot, an oscillator 104 for a CPU provided in the controller, a RAM 105 for buffer and so forth. The controller 103 includes circuits for two types of error correction, an ECC circuit 1 and an ECC circuit 2, which are directly related to the present invention.

Figure 50:
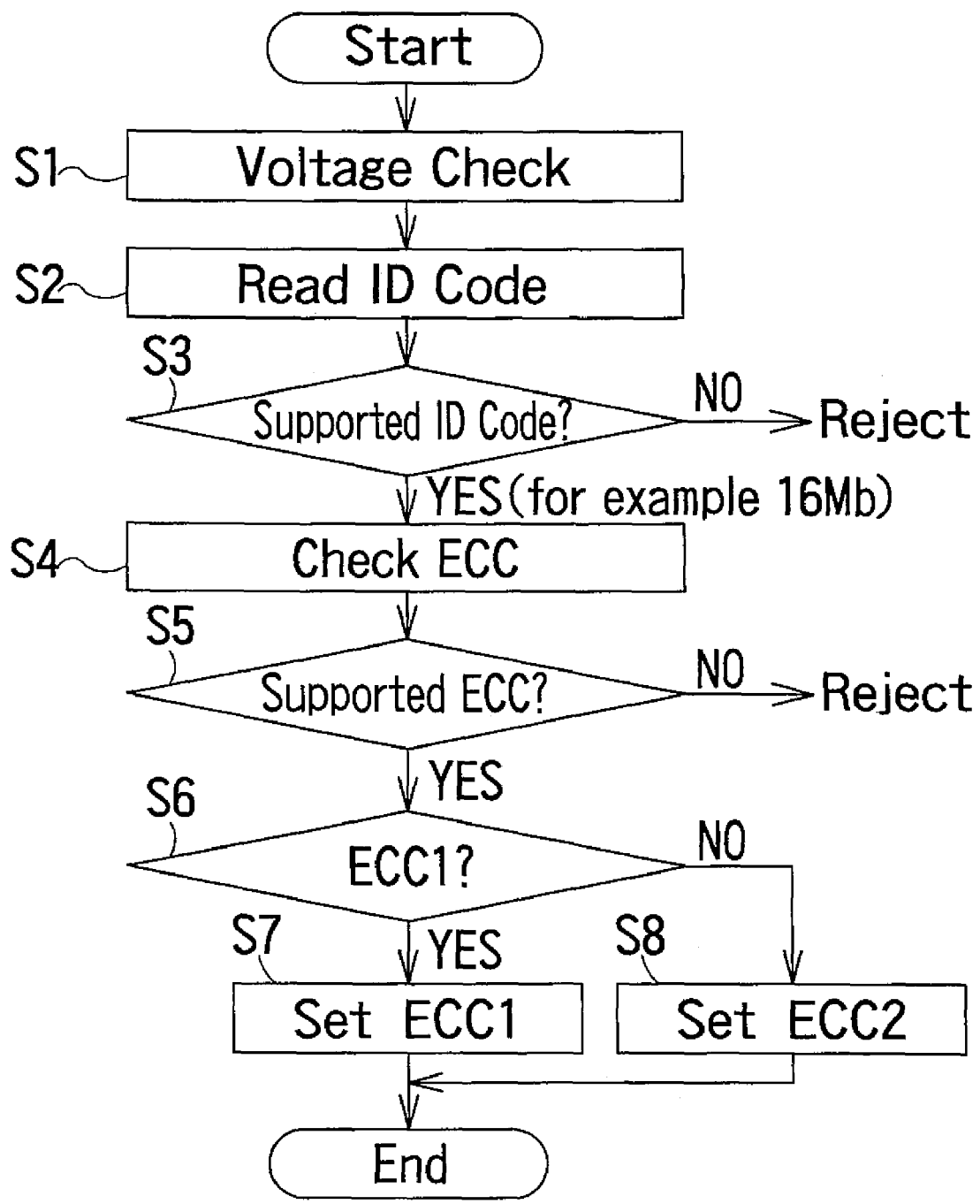
FIG. 50 is a flow chart when a flash memory card is inserted into a PC card adapter.

FIG. 50 shows an example of control when a power supply is turned on.

(Step S1) Detection of Power Supply Voltage

The memory cards include a product having a power supply voltage of 5 V and a product having a power supply voltage of 3.3 V. When a power supply voltage of 5 V is applied to a memory card operated by a power supply voltage of 3.3 V, there is a possibility that voltage destruction and so forth may be caused. In order to avoid this, the system detects the power supply voltage.

(Steps S2 and S3) ID Check

There are various kinds of flash memory cards having different storage capacities or interface specifications. When a memory card is inserted into the system, the system determines a maker code, a device code or the like of the device. When the determined code is an unsupported code, a new access is not carried out. In order to read the maker code, the device code or the like, a normal power supply voltage is inputted.

(Steps S4 through S8) ECC Check

The system of ECC is checked herein.

Examples of methods for recognizing the ECC system will be described below. A first method is a method for determining a device code similar to the above described steps S2 and S3. For example, if flash memories have the same capacity, the device code may be changed by the memory construction.

FIG. 51 shows the constructions of data and redundant divisions of a 16-Mbit flash memory in this preferred embodiment. The different point from the conventional memory shown in FIG. 4 is that a User Data Area of the redundant division is allocated to each of an ECC Flag Area and an ECC Area-3. As shown in FIG. 51, three areas of ECC Area-1 through ECC Area-3 are defined as areas for storing ECC codes. Referring to FIG. 52, a method for using the three areas will be described. Information on the ECC system is stored in an ECC Flag Area byte. For example, in the case of ECC system 1, "AAh" is defined as Flag data, and in the case of ECG system 2, "55h" is defined as Flag data.

In the case of a flash memory card based on the ECC system 1, a 3-byte ECC code of an even page data (256 bytes) enters the ECC Area-1, and a 3-byte ECC code of an odd page data (256 bytes) enters the ECC Area-2. The ECC Area-3 is null. It is possible to correct a 2-bit error of each of 256 bytes in the ECC Area-1 and ECC Area-2.

In the case of a flash memory card based on the ECC system 2, ECC codes with respect to 512 bytes are dispersed throughout the ECC Area-1, ECC Area-2 and ECC Area-3. In this case, it is possible to correct a 2-bit error in 512-byte data.

The controller 103 in the PC card adapter 102 of FIG. 49 reads the ECC Flag Area out to determine the ECC system when the flash memory card is inserted into the adapter.

In FIG. 49, the code generation and an error detection circuit, which correspond to each of the ECC system 1 and ECC system 2, are selected. The CPU in the controller controls the flow of data between the host and the RAM for buffer and the flash memory. In FIG. 49, the ECC circuit need not always be hardware. The generation of the ECC codes and so forth may be carried out by software.

The present invention should not be limited to the above described preferred embodiment. The present invention may be embodied in various ways without departing from the principle of the invention.

While the existence of two kinds of ECC systems has been assumed in the above described preferred embodiment, the present invention should not be limited thereto, but three or more kinds of ECC systems may be set.

The selection of the ECC system includes the selection that no ECC is used. In the fields of a flash memory card having very high reliability, and in the field of data, which does not require particularly high reliability, such as data in voice field or the like, the ECC is not essential. In this case, it may be defined that the ECC is not used if the content of the above described ECC Flag Area is "FFh".

While the ECC system has been defined for every flash memory in the above described preferred embodiment, the present invention should not be limited. For example, the ECC system may be switched every optional unit, such as every sector or block. In this case, the ECC system may be switched each time access is carried out for each of the above described units without simply determining the ECC system when a power supply is turned on. In addition, for example, the operation for converting data read out by the ECC system 1 to the ECC system 2 to restore the converted data may be supposed.

While the PC card adapter has been used in the above described preferred embodiment, the present invention should not be limited thereto The present invention may be applied to various apparatuses, such as a digital still camera, a PDA, a word processor and a voice recorder. Thus, according to this preferred embodiment, since a flash memory card having a very wide use range may be treated by one system, the flexibility can be remarkably improved.

According to the present invention, when a storage medium is inserted into or ejected from a connector in an electronic apparatus, the contact and breakaway of various pins are carried out in sequence, so that it is possible to improve the stability of operation and to surely protect data.

In addition, according to the present invention, when the translation between logical addresses and physical addresses is carried out by means of a translation table, a plurality of physical blocks are allocated to one logical block, so that it is possible to reduce a RAM area required for the table.

Moreover, according to the present invention, the cluster delimiter does not straddle a block serving as an erase unit, so that it is possible to decrease the numbers of erase and write operations occurring when data are rewritten.

In addition, according to the present invention, when an erase command is executed, the management area for physical blocks is open, and simultaneously, the data area is also erased, so that it is possible to improve the processing speed when a subsequent write command is executed.

In addition, according to the present invention, only the correspondence relationship in a required area of the correspondence relationships between logical blocks and physical blocks is prepared one by one, so that it is possible to reduce the RAM area required at the minimum.

In addition, according to the present invention, defective blocks are replaced with redundant blocks so that the number of defective blocks existing in each logical zone does not exceed a predetermined value after replacement, so that it is possible to improve the yield of products.

Moreover, according to the present invention, the error correction algorithm is selected in accordance with the kind of storage medium used, so that it is possible to use various storage media to improve the flexibility.

While the present invention has been disclosed in terms of the preferred embodiment in order to facilitate better understanding thereof it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for controlling a non-volatile semiconductor memory
   that includes a plurality of first units, the first unit being a minimum erase unit of the non-volatile semiconductor memory, comprising:
   arranging a master boot sector, a partition boot sector, a first file allocation table, and a second file allocation table in a file management area of the non-volatile semiconductor memory;
   receiving file data, the file data being organized into second units, the second unit being a minimum unit of file management on a file system; and
   storing the file data in a file data storing area so that a boundary of the second units is to be aligned with a boundary of the first units, wherein
   arranging includes aligning the end of the second file allocation table with the boundary of the first units.

2. A method as set forth in claim 1, wherein arranging includes reserving a specific number of empty logical sectors between the master boot sector and the partition boot sector.

3. A method as set forth in claim 1, wherein arranging includes managing the second file allocation table as a copy of the first file allocation table.

4. A method as set forth in claim 1, wherein storing includes indicating a chain between the second units corresponding to the file data by using the first and the second file allocation table.

5. A method as set forth in claim 1, further comprising:
   writing a delete mark on a directory when executing a file delete command; and
   erasing the file data stored in the first units related to the delete mark subsequent to writing the delete mark.

6. A method as set forth in claim 1, further comprising:
   writing a delete mark on a directory when executing a file delete command;
   detecting the delete mark in directories; and
   erasing the file data stored in the first units related to the delete mark.

7. The method as set forth in claim 1, wherein arranging includes allocating at least two of the first units for the file management area.

8. A method for controlling a non-volatile semiconductor memory
   that includes a plurality of first units, the first unit being a minimum erase unit of the non-volatile semiconductor memory, comprising:
   arranging a master boot sector, a partition boot sector, a first file allocation table, and a second file allocation table in a file management area of the non-volatile semiconductor memory;
   receiving file data, the file data being organized into second units, the second unit being a minimum unit of file management on a file system; and
   storing the file data in a file data storing area so that the second units do not straddle a boundary of the first units, wherein
   arranging includes aligning the end of the second file allocation table with the boundary of the first units.

9. A method as set forth in claim 8, wherein arranging includes reserving a specific number of empty logical sectors between the master boot sector and the partition boot sector.

10. A method as set forth in claim 8, wherein arranging includes managing the second file allocation table as a copy of the first file allocation table.

11. A method as set forth in claim 8, wherein storing includes indicating a chain between the second units corresponding to the file data by using the first and second file allocation table.

12. A method as set forth in claim 8, further comprising:
   writing a delete mark on a directory when executing a file delete command; and
   erasing the file data stored in the first units related to the delete mark subsequent to writing the delete mark.

13. A method as set forth in claim 8, further comprising:
   writing a delete mark on a directory when executing a file delete command;
   detecting the delete mark in directories; and
   erasing the file data stored in the first units related to the delete mark.

14. The method as set forth in claim 8, wherein arranging includes allocating at least two of the first units for the file management area.

* * * * *